(12) United States Patent
Kudo

(10) Patent No.: US 9,876,049 B2
(45) Date of Patent: Jan. 23, 2018

(54) PHOTOELECTRIC CONVERSION DEVICE, METHOD FOR MANUFACTURING PHOTOELECTRIC CONVERSION DEVICE, AND ELECTRONIC APPARATUS

(71) Applicant: Seiko Epson Corporation, Tokyo (JP)

(72) Inventor: Manabu Kudo, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/950,327

(22) Filed: Nov. 24, 2015

(65) Prior Publication Data
US 2016/0163761 A1   Jun. 9, 2016

(30) Foreign Application Priority Data

Dec. 5, 2014   (JP) ................ 2014-246582
Jun. 17, 2015  (JP) ................ 2015-121781

(51) Int. Cl.
| | |
|---|---|
| *H01L 27/146* | (2006.01) |
| *H01L 25/04* | (2014.01) |
| *H01L 31/0224* | (2006.01) |
| *H01L 31/032* | (2006.01) |
| *H01L 31/109* | (2006.01) |
| *H01L 31/14* | (2006.01) |

(52) U.S. Cl.
CPC ...... *H01L 27/14649* (2013.01); *H01L 25/043* (2013.01); *H01L 27/14623* (2013.01); *H01L 27/14632* (2013.01); *H01L 27/14634* (2013.01); *H01L 27/14687* (2013.01); *H01L 27/14689* (2013.01); *H01L 31/0224* (2013.01); *H01L 31/022408* (2013.01); *H01L 31/0322* (2013.01); *H01L 31/109* (2013.01); *H01L 31/145* (2013.01); *H01L 2924/0002* (2013.01); *Y02E 10/541* (2013.01); *Y02P 70/521* (2015.11)

(58) Field of Classification Search
CPC ............ H01L 31/0749; H01L 31/0322; H01L 31/046; H01L 31/18; H01L 31/03923
See application file for complete search history.

(56) References Cited

U.S. PATENT DOCUMENTS

| | | |
|---|---|---|
| 2009/0145472 A1 | 6/2009 | Li |
| 2012/0174977 A1 | 7/2012 | Choi |
| (Continued) | | |

FOREIGN PATENT DOCUMENTS

| | | |
|---|---|---|
| EP | 1950811 A1 | 7/2008 |
| EP | 2490264 A1 | 8/2012 |
| (Continued) | | |

OTHER PUBLICATIONS

Extended European Search Report for Patent Application No. EP15197736.0 dated May 9, 2016 (10 pages).

*Primary Examiner* — Tony Tran
(74) *Attorney, Agent, or Firm* — Harness, Dickey & Pierce, P.L.C.

(57) ABSTRACT

An image sensor as a photoelectric conversion device includes: a lower electrode containing a high-melting-point metal; an upper electrode disposed in a layer higher than the lower electrode; a p-type semiconductor layer and an n-type semiconductor layer disposed between the lower electrode and the upper electrode; and a relay electrode containing the high-melting-point metal. The lower electrode and the relay electrode are formed in the same layer. An intermediate layer as a selenized film of the high-melting-point metal is formed on the lower electrode.

12 Claims, 14 Drawing Sheets

(56) References Cited

U.S. PATENT DOCUMENTS

| | | |
|---|---|---|
| 2012/0205649 A1 | 8/2012 | Hattori et al. |
| 2013/0000700 A1 | 1/2013 | Lee |
| 2014/0077321 A1 | 3/2014 | Miyata et al. |
| 2014/0130856 A1 | 5/2014 | Chen et al. |

FOREIGN PATENT DOCUMENTS

| | | |
|---|---|---|
| EP | 2804217 A1 | 11/2014 |
| EP | 2913852 A1 | 9/2015 |
| JP | 2012-169517 A | 9/2012 |
| JP | 2013-506991 A | 2/2013 |
| JP | 2014-503127 A | 2/2014 |
| JP | 2014-067951 A | 4/2014 |
| JP | 2014-204053 A | 10/2014 |

…

PHOTOELECTRIC CONVERSION DEVICE, METHOD FOR MANUFACTURING PHOTOELECTRIC CONVERSION DEVICE, AND ELECTRONIC APPARATUS

BACKGROUND

1. Technical Field

The present invention relates to a photoelectric conversion device, a method for manufacturing a photoelectric conversion device, and an electronic apparatus.

2. Related Art

Photoelectric conversion devices including a semiconductor layer composed of a CIS-based film or CGIS-based film with chalcopyrite structure are known (e.g., see JP-A-2012-169517). A photoelectric conversion device disclosed in JP-A-2012-169517 includes a lower electrode (first electrode), an upper electrode (second electrode), and a semiconductor layer (photoelectric conversion portion) provided between the electrodes. The lower electrode is formed of a high-melting-point metal such as molybdenum (Mo), and the semiconductor layer with chalcopyrite structure composed of a CIS-based film is formed on the lower electrode by a sputtering method.

Here, when the lower electrode made of a high-melting-point metal and the semiconductor layer with chalcopyrite structure are disposed in contact with each other as in the photoelectric conversion device disclosed in JP-A-2012-169517, the contact resistance between the lower electrode and the semiconductor layer is increased to deteriorate electrical characteristics, and thus there is a problem that the sensitivity of the photoelectric conversion device is reduced. Hence, if a surface layer portion of the lower electrode is selenized to form a selenized film, an ohmic contact is obtained at each of boundaries between the lower electrode and the selenized film and between the selenized film and the semiconductor layer, and thus the contact resistance between the lower electrode and the semiconductor layer is minimized. However, when the photoelectric conversion device includes a wiring portion, relay electrode, or the like that is formed of the same high-melting-point metal in the same layer as the lower electrode, a surface layer portion of the wiring portion or relay electrode is also selenized in the selenization of the surface layer portion of the lower electrode. Therefore, the wiring resistance is increased, and at the same time, the contact resistance between the wiring portion or relay electrode and an electrode in a higher layer is also increased, and thus there is a problem that the operation of the photoelectric conversion device may become unstable.

SUMMARY

An advantage of some aspects of the invention is to solve at least a part of the problems described above, and the invention can be implemented as the following forms or application examples.

APPLICATION EXAMPLE 1

A photoelectric conversion device according to this application example includes: a first electrode containing a first metal; a second electrode disposed in a layer higher than the first electrode; a semiconductor layer disposed between the first electrode and the second electrode; and a third electrode containing the first metal, wherein the first electrode and the third electrode are formed in the same layer, and a selenized film of the first metal is formed on the first electrode.

According to this configuration, since the selenized film of the first metal is formed on the first electrode in the photoelectric conversion device including the semiconductor layer disposed between the first electrode and the second electrode, the selenized film is in contact with the first electrode, and the semiconductor layer is in contact with the selenized film. Therefore, since an ohmic contact is obtained at each of boundaries between the first electrode and the selenized film and between the selenized film and the semiconductor layer, the contact resistance between the first electrode and the semiconductor layer can be minimized compared to the case where the first electrode and the semiconductor layer are in contact with each other. Moreover, the first electrode and the third electrode are formed in the same layer using the same first metal. Therefore, if, for example, the first electrode is an electrode of a light-receiving element and the third electrode is a relay electrode or wiring portion, the photoelectric conversion device can be of simple configuration. Besides, since the selenized film of the first metal is not formed on the third electrode, the wiring resistance of the third electrode can be minimized. Due to these, it is possible to provide the photoelectric conversion device that stably operates with high sensitivity.

APPLICATION EXAMPLE 2

In the photoelectric conversion device of the application example, it is preferable that a layer thickness of the first electrode is thinner than a layer thickness of the third electrode.

According to this configuration, in the first electrode and the third electrode that are formed in the same layer using the first metal, the layer thickness of the first electrode on which the selenized film is formed is thinner than the layer thickness of the third electrode. It is considered from this that the selenized film on the first electrode is formed by selenizing a surface layer portion of the first electrode, and that a surface layer portion of the third electrode is not selenized. Hence, the wiring resistance of the third electrode can be minimized while minimizing the contact resistance between the first electrode and the semiconductor layer.

APPLICATION EXAMPLE 3

In the photoelectric conversion device of the application example, it is preferable that an insulating layer including an opening is formed on the first electrode and the third electrode, and that the selenized film is disposed in a region overlapping the opening in a plan view.

According to this configuration, the insulating layer is formed so as to cover the third electrode, and includes the opening overlapping the selenized film on the first electrode in the plan view. Hence, by performing selenization after forming the insulating layer on the first electrode and the third electrode, a region overlapping the opening in the plan view in the first electrode can be selenized without selenizing the third electrode.

APPLICATION EXAMPLE 4

In the photoelectric conversion device of the application example, it is preferable that a metal oxide layer including an opening is formed on the first electrode and the third electrode, and that the selenized film is disposed in a region overlapping the opening in a plan view.

According to this configuration, the metal oxide layer is formed so as to cover the third electrode, and includes the opening overlapping the selenized film on the first electrode in the plan view. Hence, by performing selenization after forming the metal oxide layer on the first electrode and the third electrode, a region overlapping the opening in the plan view in the first electrode can be selenized without selenizing the third electrode. Moreover, when a semiconductor film serving as the semiconductor layer is formed so as to cover the first electrode and the third electrode, the semiconductor film is formed in contact with the metal oxide layer in a region other than that in the opening. Therefore, compared to the case where the semiconductor film is formed in contact with the insulating layer, the adhesion of the semiconductor film is improved, and thus the lifting or film peeling-off is less likely to occur.

APPLICATION EXAMPLE 5

In the photoelectric conversion device of the application example, it is preferable that the second electrode and the third electrode are electrically connected.

According to this configuration, the second electrode formed in the layer higher than the first electrode is electrically connected with the third electrode formed in the same layer as the first electrode. Therefore, the second electrode includes a portion disposed in the layer higher than the first electrode and a portion disposed in the same layer as the first electrode and electrically connected with the third electrode. Hence, the second electrode can be electrically connected via the third electrode disposed on the lower layer side with, for example, a relay wiring or transistor. Moreover, since the selenized film is not formed on the third electrode, the contact resistance between the second electrode and the third electrode can be minimized.

APPLICATION EXAMPLE 6

In the photoelectric conversion device of the application example, it is preferable that the photoelectric conversion device further includes a transistor, and that the third electrode is electrically connected to a gate electrode of the transistor.

According to this configuration, since the third electrode electrically connected with the second electrode is electrically connected to the gate electrode of the transistor, the potential of the second electrode can be amplified by the transistor.

APPLICATION EXAMPLE 7

In the photoelectric conversion device of the application example, it is preferable that the semiconductor layer includes a semiconductor film with chalcopyrite structure.

According to this configuration, since the semiconductor layer including the semiconductor film with chalcopyrite structure between the first electrode and the second electrode is included, it is possible to provide the photoelectric conversion device with high sensitivity to the near-infrared light.

APPLICATION EXAMPLE 8

An electronic apparatus according to this application example includes the photoelectric conversion device according to the application example and a light-emitting device stacked on the photoelectric conversion device.

According to this configuration, it is possible to provide the electronic apparatus that receives, with the photoelectric conversion device, light emitted from the light-emitting device and reflected by a subject such as a living body, and can stably detect, with high sensitivity, information such as biological information.

APPLICATION EXAMPLE 9

A method for manufacturing a photoelectric conversion device according to this application example includes: depositing, on a substrate, a conductive film containing a first metal to form a first electrode and a third electrode; forming an insulating layer covering the third electrode and including an opening on the first electrode; forming, in the opening, a metal film containing a Group 11 element and a Group 13 element; and selenizing the metal film, wherein in the selenizing, a surface layer portion of the first electrode is converted into a selenide of the first metal.

According to this manufacturing method, the first electrode and the third electrode are formed of the conductive film containing the first metal on the substrate; the insulating layer covering the third electrode and including the opening on the first electrode is formed on the first electrode and the third electrode; the metal film containing a Group 11 element and a Group 13 element is formed in the opening; and thereafter, the metal film is selenized. Due to this, since the metal film containing a Group 11 element and a Group 13 element is selenized and converted into the semiconductor film with chalcopyrite structure, it is possible to manufacture a photoelectric conversion device with high sensitivity to the near-infrared light. Moreover, in the selenizing of the metal film, the surface layer portion of the first electrode is selenized to form a selenized film made of a selenide of the first metal on the first electrode, and thus an ohmic contact is obtained at boundaries between the first electrode and the selenized film and between the selenized film and the semiconductor film. Therefore, the contact resistance between the first electrode and the semiconductor film can be minimized. On the other hand, since the third electrode is covered with the insulating layer, a surface layer portion of the third electrode is not selenized in the selenizing of the metal film. Therefore, the wiring resistance of the third electrode can be minimized. Due to these, it is possible to manufacture a photoelectric conversion device that stably operates with high sensitivity.

APPLICATION EXAMPLE 10

A method for manufacturing a photoelectric conversion device according to this application example includes: depositing, on a substrate, a conductive film containing a first metal to form a first electrode and a third electrode; forming a metal oxide layer covering the third electrode and including an opening on the first electrode; forming, in the opening, a metal film containing a Group 11 element and a Group 13 element; and selenizing the metal film, wherein in the selenizing, a surface layer portion of the first electrode is converted into a selenide of the first metal.

According to this manufacturing method, the first electrode and the third electrode are formed of the conductive film containing the first metal on the substrate; the metal oxide layer covering the third electrode and including the opening on the first electrode is formed on the first electrode and the third electrode; the metal film containing a Group 11 element and a Group 13 element is formed in the opening; and thereafter, the metal film is selenized. Due to this, since the metal film containing a Group 11 element and a Group 13 element is selenized and converted into the semiconductor film with chalcopyrite structure, it is possible to manufacture a photoelectric conversion device with high sensitivity to the near-infrared light. Moreover, in the selenizing of the metal film, the surface layer portion of the first electrode is selenized to form a selenized film made of a selenide of the first metal on the first electrode, and thus an ohmic contact is obtained at boundaries between the first electrode and the selenized film and between the selenized film and the semiconductor film. Therefore, the contact resistance between the first electrode and the semiconductor film can be minimized. On the other hand, since the third electrode is covered with the metal oxide layer, a surface layer portion of the third electrode is not selenized in the selenizing of the metal film. Therefore, the wiring resistance of the third electrode can be minimized. Moreover, when the metal film containing a Group 11 element and a Group 13 element is formed so as to cover a region in the opening and the other region to form the semiconductor film with chalcopyrite structure, the semiconductor film is formed in contact with the metal oxide layer in the region other than that in the opening. Therefore, compared to the case where the semiconductor film is formed in contact with the insulating layer, the adhesion of the semiconductor film is improved and thus the lifting or film peeling-off is less likely to occur. Due to these, it is possible to more stably manufacture the photoelectric conversion device that stably operates with high sensitivity.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments in which the invention is embodied will be described with reference to the drawings. The drawings to be used are appropriately enlarged or reduced in size, or exaggeratedly illustrated so that a portion to be described is in a recognizable state. Moreover, components other than those necessary for description are not illustrated in some cases.

In the following forms, for example, something "on a/the substrate" means that it may be disposed on the substrate so as to be in contact with the substrate, disposed above the substrate with another member therebetween, or disposed such that a portion of it is in contact with the substrate but another portion of it is disposed on another member disposed on the substrate.

In an embodiment, an image sensor is taken as an example of a photoelectric conversion device, and a biological information acquiring device to which the image sensor is applied will be described as an example of an electronic apparatus.

Electronic Apparatus

Figure 1:
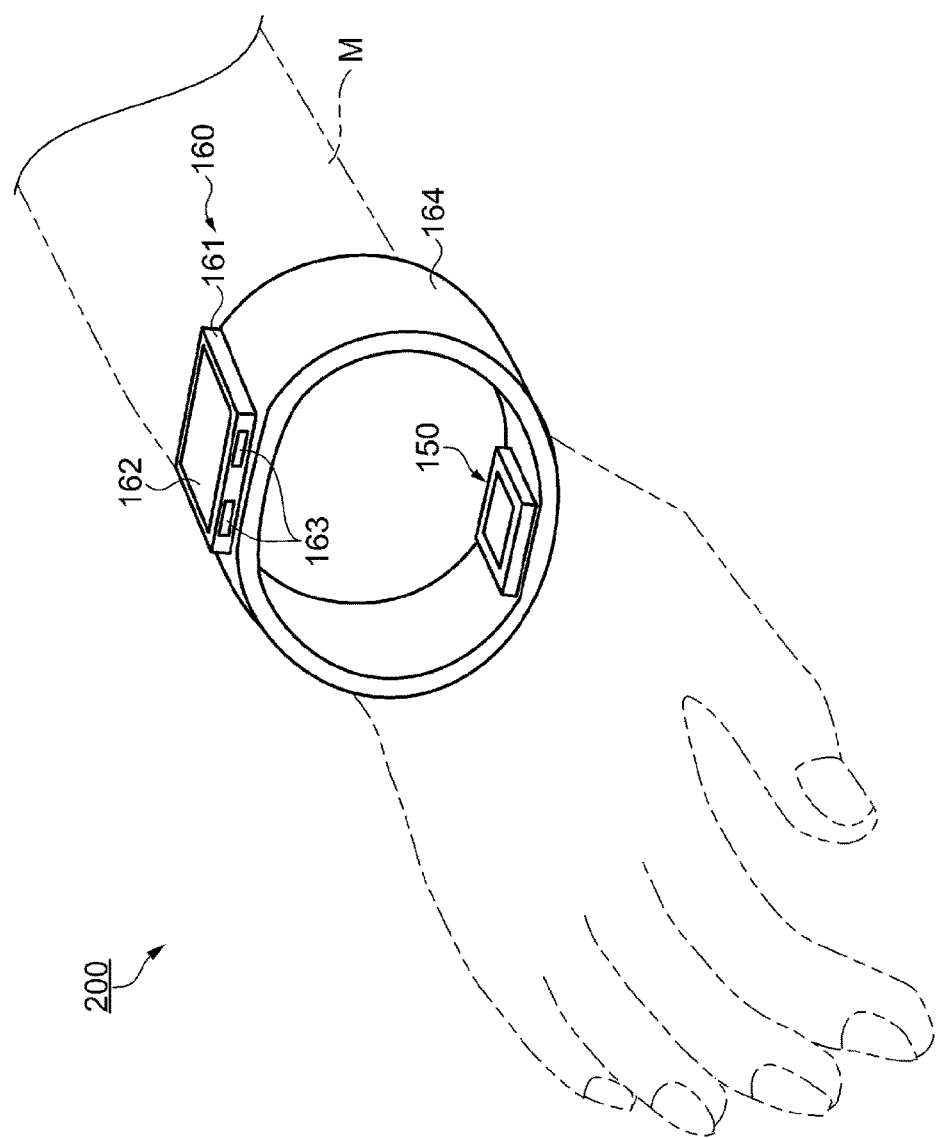
FIG. 1 is a perspective view showing a configuration of a biological information acquiring device as one example of an electronic apparatus according to an embodiment.
Figure 2:
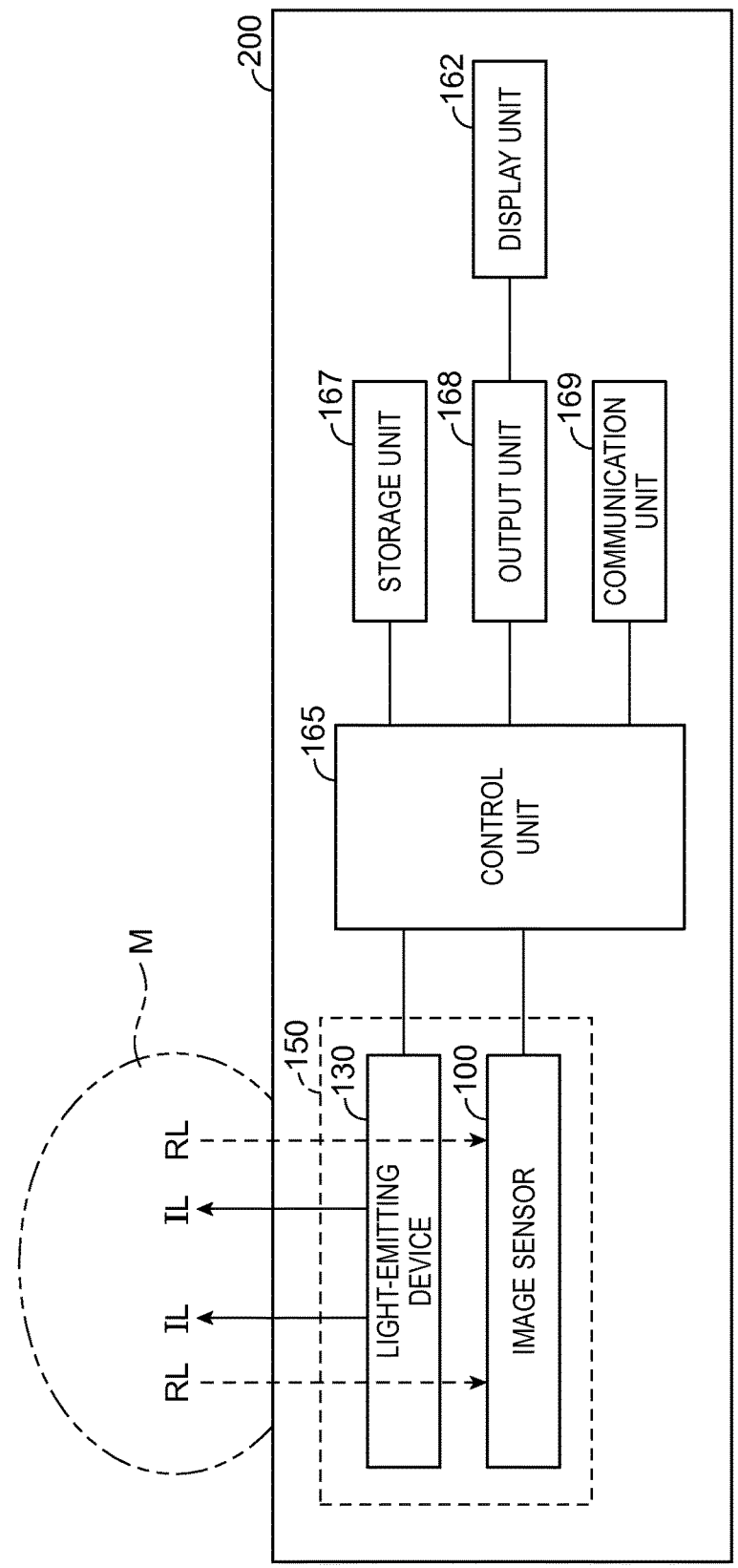
FIG. 2 is a block diagram showing an electrical configuration of the biological information acquiring device.

The biological information acquiring device as one example of the electronic apparatus including the photoelectric conversion device according to the embodiment will be described with reference to FIGS. 1 and 2. FIG. 1 is a perspective view showing a configuration of the biological information acquiring device as one example of the electronic apparatus according to the embodiment. FIG. 2 is a block diagram showing an electrical configuration of the biological information acquiring device.

As shown in FIG. 1, the biological information acquiring device 200 according to the embodiment is a portable information terminal device to be worn on the wrist of a human body M. In the biological information acquiring device 200, the position of a blood vessel in a living body can be specified from image information of the blood vessel within the wrist, or the blood-sugar level can be specified by non-invasively and optically detecting the content of a specific component, such as glucose, in the blood of the blood vessel.

The biological information acquiring device 200 includes a ring-shaped belt 164 that can be worn on the wrist, a main body unit 160 attached on the outer side of the belt 164, and a sensor unit 150 attached on the inner side of the belt 164 at a position opposed to the main body unit 160.

The main body unit 160 includes a main body case 161 and a display unit 162 incorporated into the main body case 161. In addition to the display unit 162, operation buttons 163, a circuit system (see FIG. 2) such as a control unit 165 described later, a battery as a power supply, and the like are incorporated into the main body case 161.

The sensor unit 150 includes, as a light-receiving unit, an image sensor 100 as the photoelectric conversion device according to the embodiment (see FIG. 2). The sensor unit 150 is electrically connected with the main body unit 160 by means of a wiring (not shown in FIG. 1) incorporated into the belt 164. The image sensor 100 includes a plurality of photosensors 50 as photoelectric conversion elements. Each of the photosensors 50 includes a photodiode 20 as a light-receiving element (see FIG. 4).

The biological information acquiring device 200 is worn on the wrist in use such that the sensor unit 150 is in contact with the wrist on the palm side of the hand opposite to the back of the hand. By wearing the biological information acquiring device 200 in this manner, it is possible to avoid a fluctuation in the detection sensitivity of the sensor unit 150 due to skin colors.

Although the biological information acquiring device 200 according to the embodiment has a configuration in which the main body unit 160 and the sensor unit 150 are separately incorporated with the belt 164, the biological information acquiring device 200 may have a configuration in which the main body unit 160 and the sensor unit 150 are integrated together and incorporated with the belt 164.

As shown in FIG. 2, the biological information acquiring device 200 includes the control unit 165, and the sensor unit 150, a storage unit 167, an output unit 168, and a communication unit 169 that are electrically connected to the control unit 165. Moreover, the biological information acquiring device 200 includes the display unit 162 electrically connected to the output unit 168.

The sensor unit 150 includes a light-emitting device 130 and the image sensor 100. The light-emitting device 130 and the image sensor 100 are electrically connected to the control unit 165. The light-emitting device 130 includes a light source portion that emits near-infrared light IL at a wavelength ranging from 700 nm to 2000 nm. The control unit 165 drives the light-emitting device 130 to cause the light-emitting device 130 to emit the near-infrared light IL. The near-infrared light IL propagates into the human body M and scatters therein. A portion of the near-infrared light IL that has scattered in the human body M can be received as reflected light RL by the image sensor 100.

The control unit 165 can cause the storage unit 167 to store information of the reflected light RL received by the image sensor 100. The control unit 165 causes the output unit 168 to process the information of the reflected light RL. The output unit 168 converts the information of the reflected light RL into image information of blood vessels and outputs the image information, or converts the information of the reflected light RL into information of the content of a specific component in the blood and outputs the information. Moreover, the control unit 165 can cause the display unit 162 to display the converted image information of blood vessels or the information of the specific component in the blood. Then, the control unit 165 can transmit the information from the communication unit 169 to another information processor.

Moreover, the control unit 165 can receive information such as a program from another information processor via the communication unit 169, and cause the storage unit 167 to store the information. The communication unit 169 may be a wired communication unit that is connected with another information processor by means of a wire, or a wireless communication unit such as Bluetooth (registered trademark). The control unit 165 may cause the display unit 162 to display, not only the information about the acquired blood vessel or blood, but also the information of the program previously stored in the storage unit 167 or information such as a current time. Moreover, the storage unit 167 may be a detachable memory.

Sensor Unit

Figure 3:
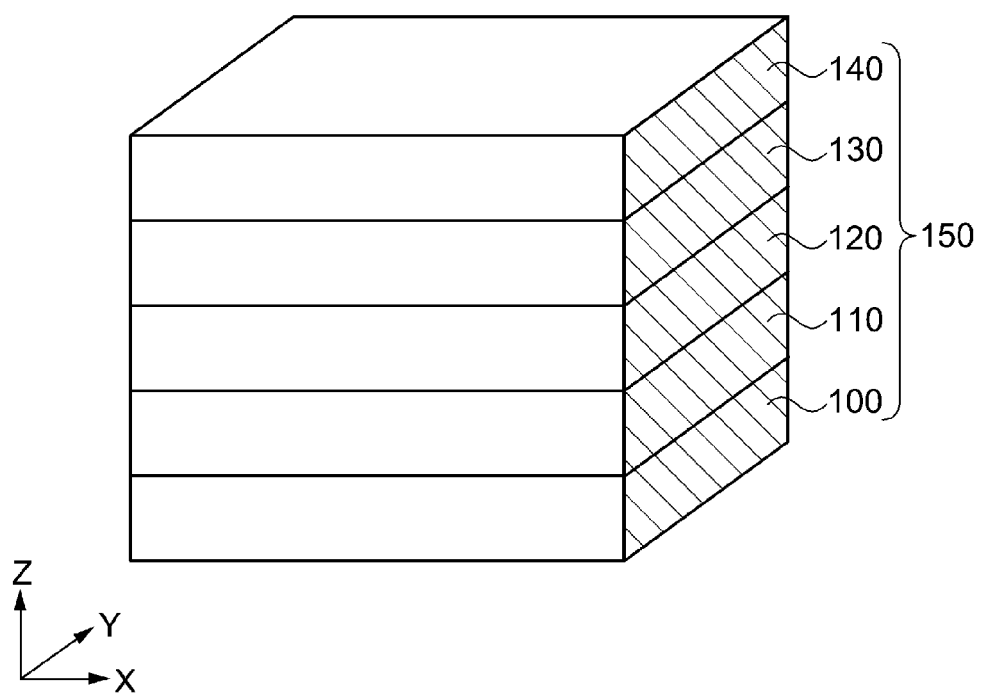
FIG. 3 is a schematic perspective view showing a configuration of a sensor unit.
Figure 4:
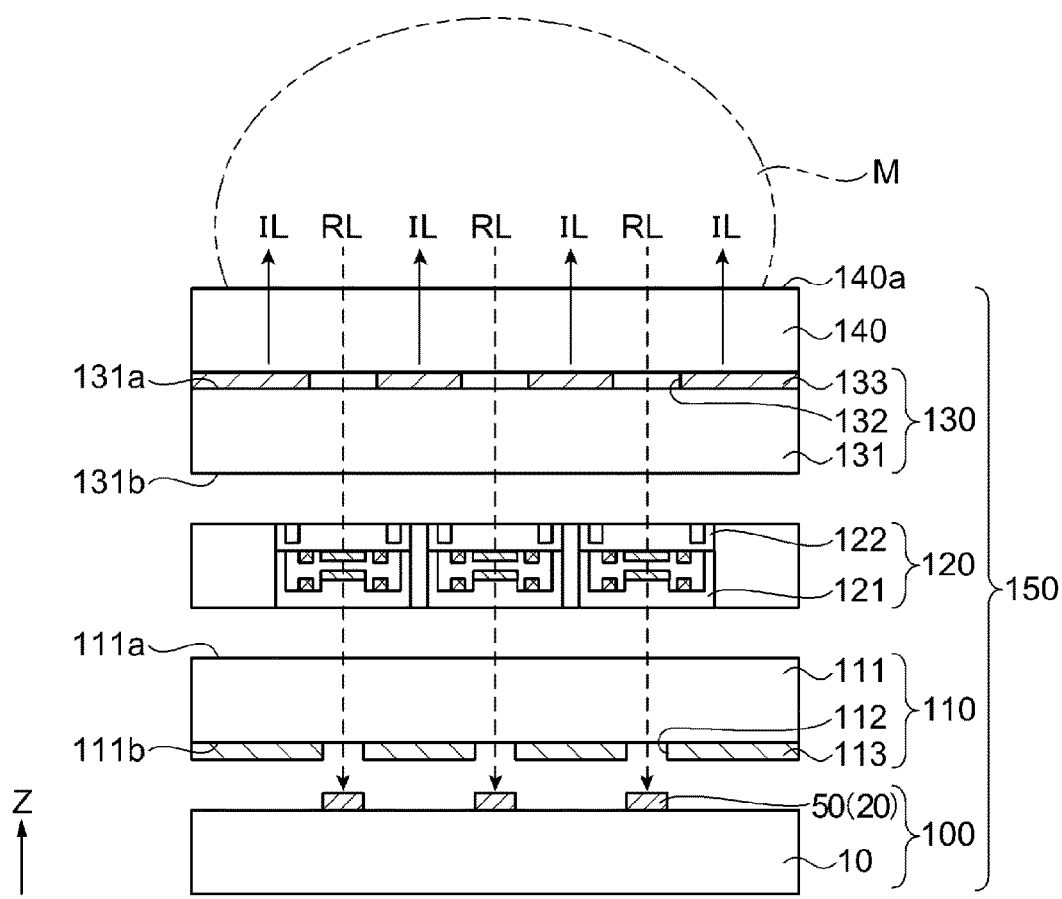
FIG. 4 is a schematic cross-sectional view showing a structure of the sensor unit.

Next, the sensor unit 150 of the biological information acquiring device 200 according to the embodiment will be described with reference to FIGS. 3 and 4. FIG. 3 is a schematic perspective view showing a configuration of the sensor unit. FIG. 4 is a schematic cross-sectional view showing a structure of the sensor unit.

As shown in FIG. 3, the sensor unit 150 includes the image sensor 100, a light-shielding portion 110, a variable spectral portion 120, the light-emitting device 130, and a protective portion 140. Each of these portions has a plate shape. The sensor unit 150 is configured such that the light-shielding portion 110, the variable spectral portion 120, the light-emitting device 130, and the protective portion 140 are stacked in this order on the image sensor 100.

The sensor unit 150 includes a case (not shown) that accommodates a stacked body including the portions stacked on top of one another and can be attached to the belt 164. In the following description, a direction along one side portion of the stacked body is defined as an X-direction, a direction along another side portion orthogonal to the one side portion is defined as a Y-direction, and a direction along a thickness direction of the stacked body is defined as a Z-direction. Moreover, viewing the sensor unit 150 from a normal direction (Z-direction) of the protective portion 140 is referred to as "plan view".

As shown in FIG. 4, the light-emitting device 130 includes a light-transmissive substrate main body 131, light source portions 133 provided on one surface 131a of the substrate main body 131, and light-transmissive portions 132. As the light source portion 133, for example, an LED element, an organic electroluminescence element, or the like can be used. The protective portion 140 is provided so as to overlap the light source portions 133 and the light-transmissive portions 132. The protective portion 140 is, for example, a cover glass or a transparent plate such as plastic.

The human body M is disposed so as to be in contact with one surface 140a of the protective portion 140. The light source portion 133 is configured so as to allow the near-infrared light IL to be emitted to the protective portion 140 side. The reflected light RL, which is a portion of the near-infrared light IL that has scattered in the human body M, transmits through the light-transmissive portion 132 and is guided to the variable spectral portion 120 in a lower layer.

The variable spectral portion 120 includes fixed substrates 121 and movable substrates 122. In the variable spectral portion 120, a spectral distribution (spectral characteristic) of the reflected light RL transmitting through the variable spectral portion 120 can be changed by electrically controlling a gap between the fixed substrate 121 and the movable substrate 122. The reflected light RL that has transmitted through the variable spectral portion 120 is guided to the light-shielding portion 110 in a lower layer.

The light-shielding portion 110 includes a light-transmissive substrate main body 111 and a light-shielding film 113 provided on a surface 111b of the substrate main body 111 on the side opposite to a surface 111a thereof on the variable spectral portion 120 side. Openings (pinholes) 112 are formed in the light-shielding film 113 at positions corresponding to the arrangement of the light-transmissive portions 132 of the light-emitting device 130. The light-shielding portion 110 is disposed between the variable spectral portion 120 and the image sensor 100 such that only the reflected light RL that has transmitted through the openings 112 is guided to the photodiodes 20 while the other reflected light RL is blocked by the light-shielding film 113.

The image sensor 100 has high photosensitivity to the near-infrared light. A detailed configuration of the image sensor 100 will be described later. The image sensor 100 is disposed such that the side thereof on which the photodiodes 20 are provided faces the light-shielding portion 110. Each of the plurality of photodiodes 20 is disposed at a position corresponding to the arrangement of the opening 112 in the light-shielding portion 110. The reflected light RL that has transmitted through the opening 112 is incident on the photodiode 20.

In addition to the configuration described above, for suppressing the mixing of the visible light into the reflected light RL to be incident on the photodiode 20, a filter that cuts off light in, for example, the visible light wavelength range (400 nm to 700 nm) may be disposed corresponding to the light-transmissive portions 132 of the light-emitting device 130 or the openings 112 of the light-shielding portion 110.

The configuration of the sensor unit 150 is not limited to that described above. For example, the light-emitting device 130 may be configured to include the protective portion 140, and may have a structure in which the light source portions 133 are sealed by the protective portion 140. Moreover, since the light that has transmitted through the light-transmissive portion 132 may be reflected at an interface of a member having a different refractive index and thus attenuated, the light-emitting device 130 and the variable spectral portion 120 may be bonded together such that, for example, a surface 131b of the substrate main body 131 of the light-emitting device 130 is in contact with the variable spectral portion 120. Moreover, the variable spectral portion 120 and the surface 111a of the light-shielding portion 110 may be bonded together so as to be in contact with each other. By doing this, a positional relationship therebetween in a thickness direction (Z-direction) thereof can be ensured.

First Embodiment
Photoelectric Conversion Device

Figure 5:
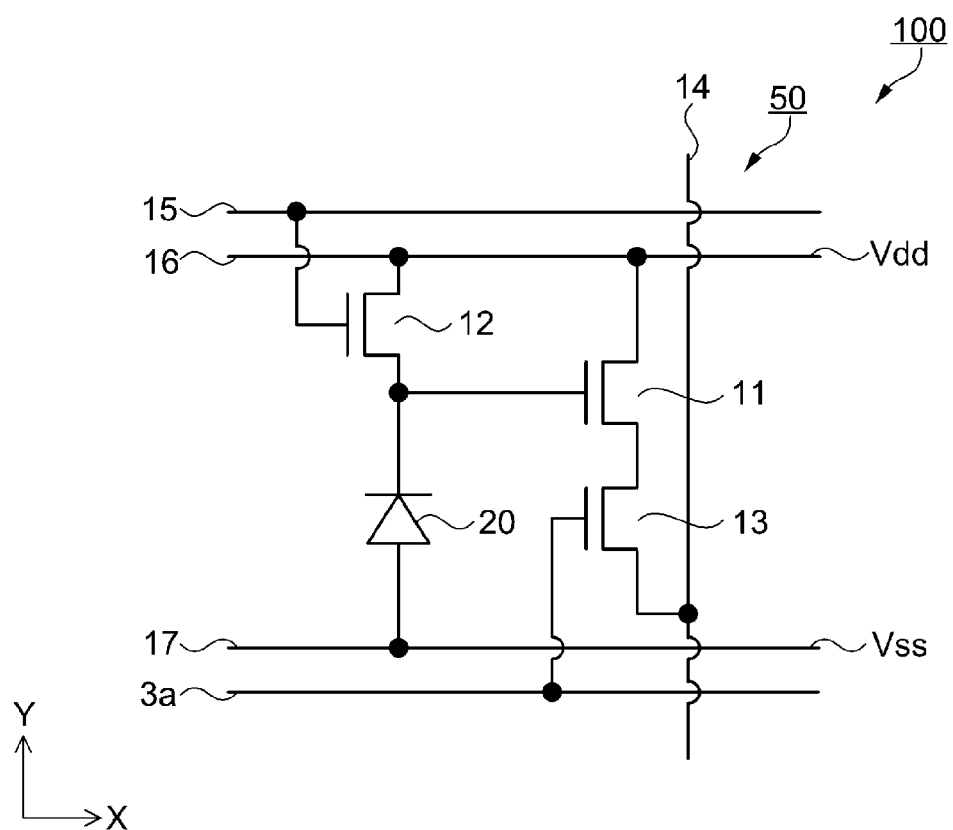
FIG. 5 is an equivalent circuit diagram showing an electrical configuration of a photosensor according to a first embodiment.
Figure 6:
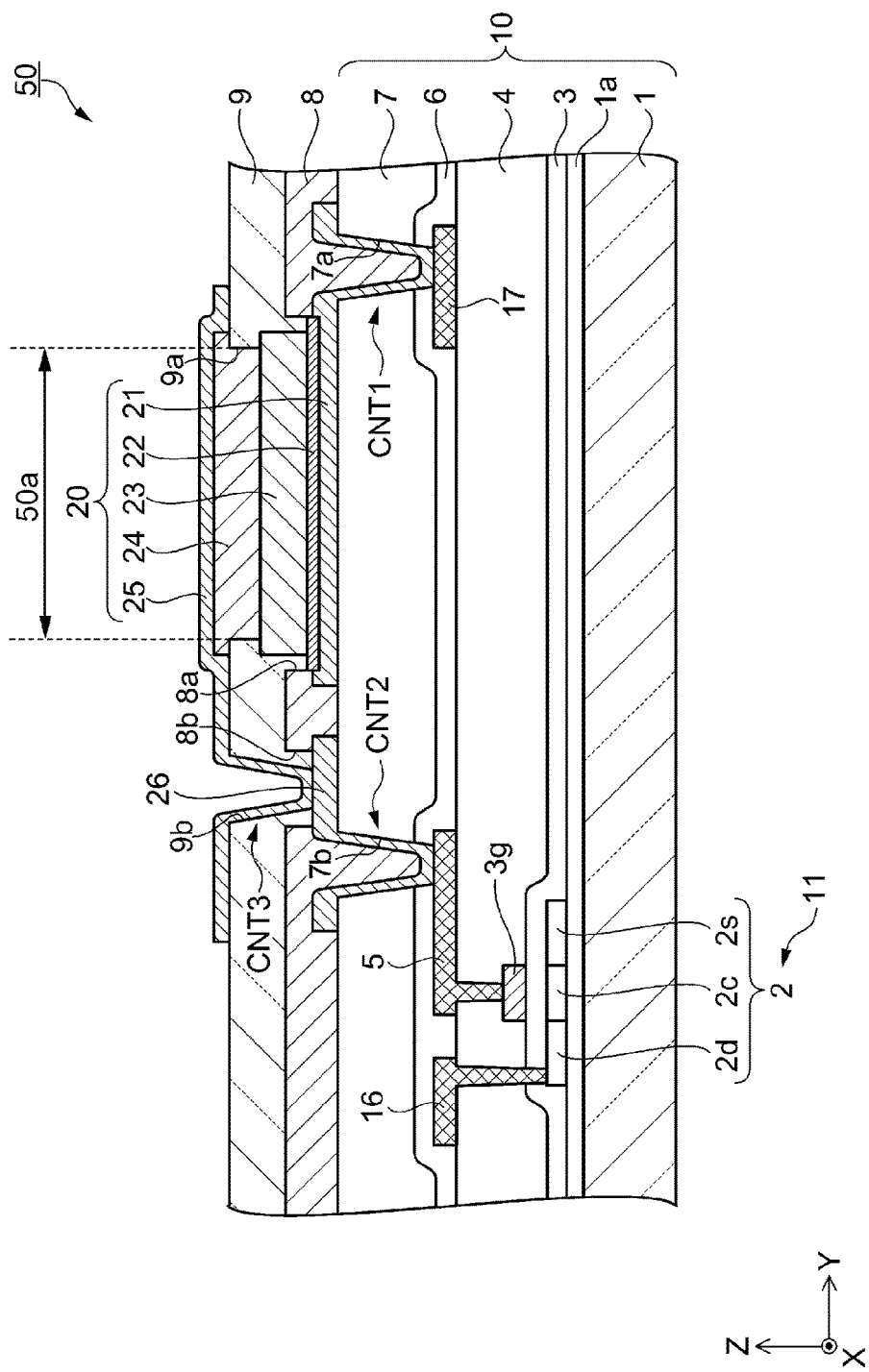
FIG. 6 is a schematic cross-sectional view showing a configuration of the photosensor according to the first embodiment.

Next, the image sensor 100 as a photoelectric conversion device according to a first embodiment will be described with reference to FIGS. 5 and 6. As described above, the image sensor 100 includes the plurality of photosensors 50 as photoelectric conversion elements. FIG. 5 is an equivalent circuit diagram showing an electrical configuration of a photosensor according to the first embodiment. FIG. 6 is a schematic cross-sectional view showing a configuration of the photosensor according to the first embodiment.

As shown in FIG. 5, the image sensor 100 includes a plurality of scanning lines 3a and a plurality of readout lines 14 intersecting the scanning lines 3a. The scanning lines 3a extend along the X-direction, while the readout lines 14 extend along the Y-direction. The photosensor 50 is provided corresponding to the intersection between the scanning line 3a and the readout line 14.

The photosensor 50 includes the photodiode 20 as a light-receiving element, an amplifying transistor 11, a reset transistor 12, and a selection transistor 13. The amplifying transistor 11, the reset transistor 12, and the selection transistor 13 are each composed of a thin film transistor (TFT).

An anode of the photodiode 20 is connected to a negative power supply line 17, and a negative power supply potential Vss is supplied to the negative power supply line 17. A cathode of the photodiode 20 is connected to a gate of the amplifying transistor 11 and a source of the reset transistor 12. A drain of the amplifying transistor 11 and a drain of the reset transistor 12 are connected to a positive power supply line 16, and a positive power supply potential Vdd is supplied to the positive power supply line 16.

A source of the amplifying transistor 11 and a drain of the selection transistor 13 are connected. A source of the selection transistor 13 is connected to the readout line 14, and a gate of the selection transistor 13 is connected to the scanning line 3a. Moreover, a gate of the reset transistor 12 is connected to a reset signal line 15.

The measurement of the amount of light is performed by the photosensor 50 as follows: First, the gate of the amplifying transistor 11 is charged to the positive power supply potential Vdd. Next, the photodiode 20 is exposed to light over, for example, a period τ. During this exposure period, the reset transistor 12 is in an OFF state. Therefore, a gate potential Vg of the amplifying transistor 11 changes in response to a junction leakage current I of the photodiode 20.

When the exposure is finished in this manner, the gate potential Vg of the amplifying transistor 11 is $Vg=Vdd-I\tau/C_T$, where $C_T$ is a transistor capacity of the amplifying transistor 11. The junction leakage current is larger as the amount of light is larger, and therefore, the gate potential Vg of the amplifying transistor 11 changes in response to the amount of light. A change in the conductance of the amplifying transistor 11 occurring as a result of the change in the gate potential is measured for each of the photosensors 50 during a readout period, whereby the amount of light emitted during the exposure period can be measured.

As shown in FIG. 6, the photosensor 50 according to the first embodiment includes a substrate 10 and the photodiode 20 provided on the substrate 10. The photodiode 20 according to the first embodiment is composed of a lower electrode 21 as a first electrode, an intermediate layer 22 as a selenized film, a p-type semiconductor layer 23, an n-type semiconductor layer 24, and an upper electrode 25 as a second electrode, which are stacked in this order from the substrate 10 side.

FIG. 6 is a cross-sectional view of the photosensor 50 along the Y-direction, in which a direction from the near side of FIG. 6 to the far side is the X-direction and an upward direction is the Z-direction. In FIG. 6, viewing the photosensor 50 from the normal direction (Z-direction) of the photodiode 20 is referred to as "plan view".

The substrate 10 includes a substrate main body 1, an insulating film 1a, the amplifying transistor 11, a gate insulating film 3, an inter-layer insulating film 4, a relay wiring 5, the positive power supply line 16, the negative power supply line 17, an insulating film 6, and a planarizing layer 7. The substrate main body 1 is made of, for example, a transparent glass, opaque silicon, or the like. The insulating film 1a is formed so as to cover the surface of the substrate main body 1.

The amplifying transistor 11 includes a semiconductor layer 2 and a gate electrode 3g. The semiconductor layer 2 is formed of, for example, polycrystalline silicon, and provided in an island-shape on the insulating film 1a. The semiconductor layer 2 includes a channel region 2c, a drain region 2d, and a source region 2s. The gate insulating film 3 is formed of an insulating material such as $SiO_2$ (silicon oxide) so as to cover the semiconductor layer 2.

The gate electrode 3g is formed on the gate insulating film 3 at a position opposed to the channel region 2c of the semiconductor layer 2. The inter-layer insulating film 4 is formed so as to cover the gate insulating film 3 and the gate electrode 3g.

The relay wiring 5, the positive power supply line 16, and the negative power supply line 17 are formed using a metal material such as Al (aluminum) on the inter-layer insulating film 4. The relay wiring 5 is electrically connected to the gate electrode 3g via a through-hole that penetrates the inter-layer insulating film 4. The positive power supply line 16 is electrically connected to the drain region 2d of the semiconductor layer 2 via a through-hole that penetrates the inter-layer insulating film 4 and the gate insulating film 3.

The insulating film 6 is formed so as to cover the relay wiring 5, the positive power supply line 16, and the negative power supply line 17. The insulating film 6 is formed using, for example, SiN (silicon nitride) or the like. The planarizing layer 7 is formed so as to cover the insulating film 6. The planarizing layer 7 is formed using, for example, $SiO_2$ (silicon oxide) or the like. A through-hole 7a is formed in the insulating film 6 and the planarizing layer 7 at a position overlapping the negative power supply line 17 in the plan view. A through-hole 7b is formed in the insulating film 6 and the planarizing layer 7 at a position overlapping the relay wiring 5 in the plan view.

The lower electrode 21 as the first electrode and a relay electrode 26 as a third electrode are formed in the same layer on the substrate 10 (on the planarizing layer 7). The lower electrode 21 and the relay electrode 26 are composed of a conductive film containing a high-melting-point metal as a first metal. Hence, the lower electrode 21 and the relay electrode 26 can be formed by depositing and patterning one conductive film in the same layer, and therefore, the photosensor 50 can be of a simple configuration.

Examples of the high-melting-point metal constituting the lower electrode 21 and the relay electrode 26 include, for example, molybdenum (Mo), tungsten (W), tantalum (Ta), and niobium (Nb). Among them, Mo has favorable electrical characteristics and is easy to manufacture, and thus is suitably used as the material of the lower electrode 21 and the relay electrode 26.

The conductive film that constitutes the lower electrode 21 is deposited so as to fill the through-hole 7a provided in the insulating film 6 and the planarizing layer 7. The conductive film that fills the through-hole 7a forms a contact hole CNT1. The lower electrode 21 is electrically connected to the negative power supply line 17 via the contact hole CNT1.

The intermediate layer 22 made of a selenide of the high-melting-point metal is formed on the lower electrode 21 so as to be in contact with the lower electrode 21. The intermediate layer 22 is a selenized film obtained by selenizing a surface layer portion of the conductive film (a conductive film 21a shown in FIG. 7A) deposited as the lower electrode 21. When Mo is used as the high-melting-point metal constituting the lower electrode 21, the intermediate layer 22 is composed of molybdenum selenide ($MoSe_2$).

The intermediate layer 22 is disposed inside the outer shape of the lower electrode 21 in the plan view. Hence, the lower electrode 21 includes a peripheral edge portion located around the intermediate layer 22 in the plan view and not overlapping the intermediate layer 22. The layer thickness of the peripheral edge portion of the lower electrode 21 is, for example, about 250 nm. The layer thickness of the lower electrode 21 at a portion overlapping the intermediate layer 22 in the plan view is thinner than the layer thickness of the peripheral edge portion, and is, for example, about 200 nm. The layer thickness of the intermediate layer 22 is, for example, about 100 nm.

When the lower electrode 21 and the intermediate layer 22 have the layer thicknesses described above, a surface layer-side portion with a layer thickness of 50 nm, in the conductive film with a layer thickness of 250 nm constituting the lower electrode 21, becomes thick by selenization and is converted into the intermediate layer 22 with a layer thickness of 100 nm. This result means that a conductive film with a layer thickness of 200 nm remains as the lower electrode 21.

In this case, if the entire planar region of the conductive film constituting the lower electrode 21 is selenized, a portion for forming the contact hole CNT1, that is, a portion to be electrically connected with the negative power supply line 17 via the through-hole 7a is also selenized on the surface layer side. If so, since the layer thickness of the conductive film not being selenized but remaining is reduced by that amount, a wiring resistance at the portion of the contact hole CNT1 is increased. In the embodiment, since the conductive film constituting the lower electrode 21 is not selenized in a region other than that overlapping the p-type semiconductor layer 23, in the plan view, to be formed in a higher layer, the wiring resistance at the portion of the contact hole CNT1 is minimized.

The conductive film constituting the relay electrode 26 is deposited so as to fill the through-hole 7b formed in the insulating film 6 and the planarizing layer 7. A portion of the conductive film constituting the relay electrode 26, which fills the through-hole 7b, forms a contact hole CNT2. The relay electrode 26 is electrically connected to the relay wiring 5 via the contact hole CNT2, and is electrically connected to the gate electrode 3g via the relay wiring 5.

The layer thickness of the relay electrode 26 is the same as the layer thickness of the peripheral edge portion of the lower electrode 21, and is, for example, about 250 nm. Hence, the layer thickness of the lower electrode 21 at a portion overlapping the intermediate layer 22 in the plan view is thinner than the layer thickness of the relay electrode 26. Moreover, a selenized film like the intermediate layer 22 is not formed on the relay electrode 26. That is, since the conductive film constituting the relay electrode 26 is not selenized, the wiring resistance of the relay electrode 26 including the portion that forms the contact hole CNT2 to be electrically connected with the relay wiring 5 can be minimized.

An insulating layer 8 is formed so as to cover the substrate 10 (the planarizing layer 7), the lower electrode 21, and the relay electrode 26. The insulating layer 8 includes an opening 8a overlapping the lower electrode 21 in the plan view, and an opening 8b overlapping the relay electrode 26 in the plan view. The opening 8a is disposed, inside the outer shape of the lower electrode 21 in the plan view, so as to overlap the intermediate layer 22. In other words, the outer shape of the lower electrode 21 is larger than the opening 8a, and the intermediate layer 22 is disposed in a region overlapping the opening 8a in the plan view.

The insulating layer 8 is composed of, for example, $SiO_x$ (silicon oxide) or $SiN_x$ (silicon nitride). In the embodiment, the insulating layer 8 is formed of SiN, and the layer thickness of the insulating layer 8 is, for example, about 200 nm.

The p-type semiconductor layer 23 is formed on the intermediate layer 22. The p-type semiconductor layer 23 is disposed, for example, inside the outer shape of the intermediate layer 22 in the plan view. That is, the p-type semiconductor layer 23 is disposed inside the opening 8a of the insulating layer 8. The p-type semiconductor layer 23 may be formed larger than the opening 8a such that a peripheral edge portion of the p-type semiconductor layer 23 rides up over the insulating layer 8.

The p-type semiconductor layer 23 is composed of a CIS-based ($CuInSe_2$) semiconductor film with chalcopyrite structure containing copper (Cu) as a Group 11 element, indium (In) as a Group 13 element, and selenium (Se) as a Group 16 element. The p-type semiconductor layer 23 may be composed of a CIGS-based (Cu(In,Ga)Se$_2$) film with chalcopyrite structure containing copper (Cu), indium (In), gallium (Ga) as a Group 13 element, and selenium (Se). The CIS-based and CIGS-based films with chalcopyrite structure have excellent photoelectric conversion rates and high photosensitivity over a wide range of wavelengths from the visible light to the near-infrared light.

In the photodiode 20, the intermediate layer 22 is disposed between the lower electrode 21 and the p-type semiconductor layer 23. That is, the intermediate layer 22 is in contact with the lower electrode 21, and the p-type semiconductor layer 23 is in contact with the intermediate layer 22. Due to this, compared to the case where the lower electrode 21 and the p-type semiconductor layer 23 are in contact with each other, an ohmic contact is obtained at each of boundaries between the lower electrode 21 and the intermediate layer 22 and between the intermediate layer 22 and the p-type semiconductor layer 23. Therefore, the contact resistance between the lower electrode 21 and the p-type semiconductor layer 23 can be minimized.

A protective layer 9 is formed so as to cover the insulating layer 8, the intermediate layer 22, and the p-type semiconductor layer 23. The protective layer 9 is composed of, for example, SiO$_x$ or SiN$_x$. In the embodiment, the protective layer 9 is formed of SiN, and the layer thickness of the protective layer 9 is, for example, about 500 nm.

The protective layer 9 includes an opening 9a overlapping the p-type semiconductor layer 23 in the plan view, and a through-hole 9b overlapping the relay electrode 26 in the plan view. The opening 9a is disposed inside the outer shape of the p-type semiconductor layer 23 in the plan view. The through-hole 9b is disposed, for example, inside the opening 8b of the insulating layer 8, and formed so as to penetrate the protective layer 9 until the through-hole 9b reaches the relay electrode 26. The through-hole 9b may be formed to have the same plane area as the opening 8b.

The n-type semiconductor layer 24 is stacked and formed on the p-type semiconductor layer 23. The n-type semiconductor layer 24 is formed, for example, larger than the opening 9a such that a peripheral edge portion of the n-type semiconductor layer 24 rides up over the protective layer 9.

The n-type semiconductor layer 24 may be composed of, for example, an i-ZnO (intrinsic zinc oxide) film as an undoped intrinsic semiconductor film and an n-type impurity-doped ZnO (n$^+$) film. The "intrinsic semiconductor film" means a semiconductor film to which donor atoms or acceptor atoms are not added on purpose. In the embodiment, an intrinsic semiconductor film is stacked on the p-type semiconductor layer 23, and further, an n-type impurity-doped semiconductor film is stacked on the intrinsic semiconductor film.

The upper electrode 25 is formed on the protective layer 9 so as to cover the n-type semiconductor layer 24. The upper electrode 25 is formed of a light-transmissive conductive film such as ITO (Indium Tin Oxide) or IZO (Indium Zinc Oxide). The conductive film constituting the upper electrode 25 extends to a region overlapping the relay electrode 26 in the plan view, and is deposited so as to fill the through-hole 9b of the protective layer 9.

A portion of the conductive film constituting the upper electrode 25, which fills the through-hole 9b, forms a contact hole CNT3. The upper electrode 25 is electrically connected to the relay electrode 26 via the contact hole CNT3, is electrically connected to the relay wiring 5 via the contact hole CNT2, and is further electrically connected to the gate electrode 3g via the relay wiring 5.

At the contact hole CNT3, the conductive film constituting the upper electrode 25 is in contact with the relay electrode 26. Since a selenized film like the intermediate layer 22 on the lower electrode 21 is not formed on the relay electrode 26, the contact resistance between the relay electrode 26 and the upper electrode 25 can be minimized.

The lower electrode 21, the intermediate layer 22, the p-type semiconductor layer 23, the n-type semiconductor layer 24, and the upper electrode 25 constitute the photodiode 20. In the photodiode 20, a region not covered with the protective layer 9 in the region of the p-type semiconductor layer 23 and the n-type semiconductor layer 24, that is, a region disposed inside the opening 9a in the plan view is a light-receiving region 50a. In the photosensor 50, when light is incident on the light-receiving region 50a, a photocurrent in response to the amount of the light flows in the photodiode 20.

As has been described above, the photodiode 20 according to the first embodiment includes the p-type semiconductor layer 23 with chalcopyrite structure, and therefore has an excellent photoelectric conversion rate and high photosensitivity over the wide range of wavelengths from the visible light to the near-infrared light. Besides, since the intermediate layer 22 composed of a selenized film is disposed between the lower electrode 21 and the p-type semiconductor layer 23 in the photodiode 20, an ohmic contact is obtained at each of the boundaries between the lower electrode 21 and the intermediate layer 22 and between the intermediate layer 22 and the p-type semiconductor layer 23. Therefore, the contact resistance between the lower electrode 21 and the p-type semiconductor layer 23 can be minimized. Moreover, since the contact hole CNT1 portion of the lower electrode 21 and the relay electrode 26 including the contact hole CNT2 portion are not selenized, the wiring resistance can be minimized. Due to these, it is possible to provide the image sensor 100 that stably operates with high sensitivity over the wide range of wavelengths from the visible light to the near-infrared light.

Method for Manufacturing Photoelectric Conversion Device

Next, a method for manufacturing the photoelectric conversion device according to the first embodiment will be described with reference to FIGS. 7A to 9C. Herein, a method for manufacturing the photosensor 50 as a feature of the invention will be described. FIGS. 7A to 9C are diagrams for explaining the method for manufacturing the photosensor according to the first embodiment. Each of FIGS. 7A to 9C corresponds to the partially enlarged view in FIG. 6.

Figure 7A:
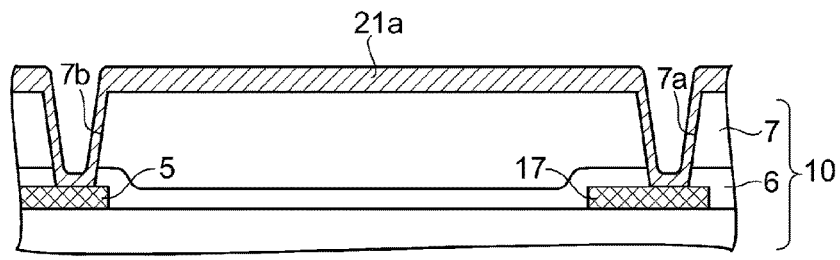
FIGS. 7A to 7D are diagrams for explaining a method for manufacturing the photosensor according to the first embodiment.

Before a step shown in FIG. 7A, the substrate 10 is prepared. The substrate 10 is obtained by forming, on the substrate main body 1, transistors such as the amplifying transistor 11, the inter-layer insulating film 4, the insulating film 6, the planarizing layer 7, and the like (see FIG. 6) using a publicly known semiconductor manufacturing technique.

First, as shown in FIG. 7A, the through-hole 7a penetrating the insulating film 6 and the planarizing layer 7 to reach the negative power supply line 17 is formed in a region overlapping the negative power supply line 17 in the plan view in the substrate 10. Moreover, the through-hole 7b penetrating the insulating film 6 and the planarizing layer 7 to reach the relay wiring 5 is formed in a region overlapping the relay wiring 5 in the plan view in the substrate 10. Then, the conductive film 21a containing a high-melting-point metal is deposited to a film thickness of 100 nm or more and 500 nm or less on the substrate 10 using, for example, physical vapor deposition (PVD). Due to this, the conductive film 21a is formed so as to cover the substrate 10 and fill the through-hole 7a and the through-hole 7b.

When the film thickness of the conductive film 21a is 100 nm or more, an increase in the wiring resistance of the conductive film 21a serving as the lower electrode 21 and the relay electrode 26 can be suppressed. On the other hand, when the film thickness of the conductive film 21a is 500 nm or less, a situation in which a difference in level caused by the lower electrode 21 and the relay electrode 26 is increased can be suppressed, and at the same time, the film peeling-off caused by a large internal stress due to a thick film can be suppressed. In the embodiment, the conductive film 21a is deposited to a film thickness of 250 nm by a sputtering method using Mo (molybdenum) as the high-melting-point metal.

Figure 7B:
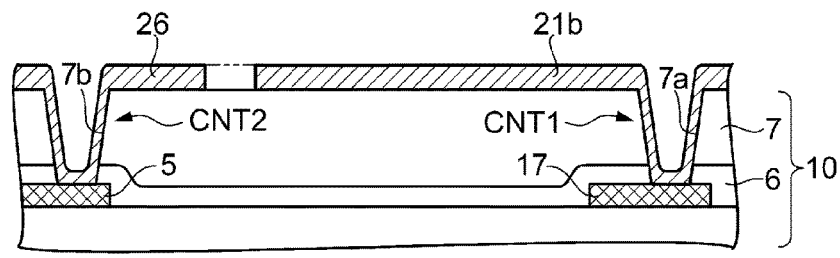

Next, as shown in FIG. 7B, the conductive film 21a is patterned to form a lower electrode film 21b and the relay electrode 26. The conductive film of the lower electrode film 21b, which fills the through-hole 7a, forms the contact hole CNT1. The lower electrode film 21b is electrically connected to the negative power supply line 17 via the contact hole CNT1. Moreover, the conductive film of the relay electrode 26, which fills the through-hole 7b, forms the contact hole CNT2. The relay electrode 26 is electrically connected to the relay wiring 5 via the contact hole CNT2.

Figure 7C:
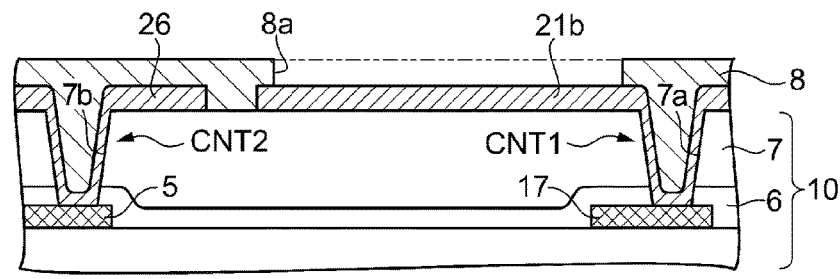

Next, as shown in FIG. 7C, the insulating layer 8 made of $SiO_x$ or $SiN_x$ is formed so as to cover the substrate 10 (the planarizing layer 7), the lower electrode film 21b, and the relay electrode 26. The insulating layer 8 is formed to a film thickness of 50 nm or more and 700 nm or less using, for example, chemical vapor deposition (CVD). The insulating layer 8 plays a role of suppressing the selenization of the lower electrode film 21b at a portion other than a desired region (region for forming the intermediate layer 22 shown in FIG. 8A) in a step of applying a heat treatment described later.

When the film thickness of the insulating layer 8 is 50 nm or more, covering properties for covering the lower electrode film 21b and the relay electrode 26 can be ensured. On the other hand, when the film thickness of the insulating layer 8 is 700 nm or less, the film peeling-off caused by a large internal stress due to a thick film can be suppressed. The film thickness of the insulating layer 8 is preferably from 100 nm to 300 nm. In the embodiment, the insulating layer 8 made of SiN is formed to a film thickness of 200 nm.

Subsequently, the opening 8a is formed in a region overlapping the lower electrode film 21b in the plan view in the insulating layer 8. The opening 8a is formed to have an area smaller than the outer shape of the lower electrode film 21b, in the region not overlapping the contact hole CNT1 in the plan view. Due to this, a region of the lower electrode film 21b, which is a portion except for the contact hole CNT1 and located inside the outer shape of the lower electrode film 21b, is exposed through the opening 8a. The relay electrode 26 is covered with the insulating layer 8.

Figure 7D:
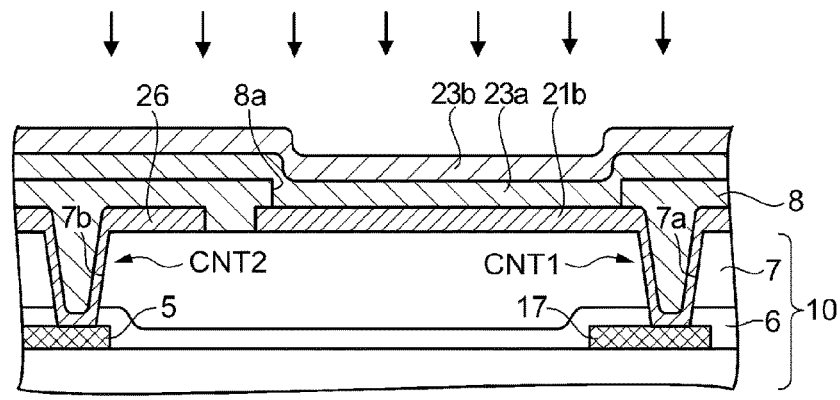

Next, as shown in FIG. 7D, a metal film containing a Group 11 element and a Group 13 element is formed on the lower electrode film 21b. In the embodiment, a metal film 23a made of copper (Cu) as a Group 11 element and a metal film 23b made of indium (In) as a Group 13 element are stacked and deposited using a sputtering method so as to cover the lower electrode film 21b exposed in the opening 8a and the insulating layer 8.

Subsequently, a heat treatment is applied to the metal film 23a and the metal film 23b in an atmosphere of gas containing a Group 16 element. As the Group 16 element, for example, selenium (Se), sulfur (S), tellurium (Te), or the like can be used. The temperature of the heat treatment is set to, for example, 400° C. or more and 550° C. or less.

In the embodiment, hydrogen selenide ($H_2Se$) is used as the gas containing a Group 16 element, and the heat treatment is applied at a temperature of 450° C. in the $H_2Se$ atmosphere. Hydrogen sulfide ($H_2S$) may be used as the gas containing a Group 16 element, and a heat treatment may be further applied in the $H_2S$ atmosphere after a heat treatment is applied in the $H_2Se$ atmosphere.

This heat treatment is a treatment to allow the metal film 23a and the metal film 23b to react with a Group 16 element to thereby be converted into the p-type semiconductor layer 23 (see FIG. 8A) with chalcopyrite structure. When the temperature of the heat treatment is 400° C. or more, the metal film 23a and the metal film 23b favorably react with a Group 16 element. On the other hand, when the temperature of the heat treatment is 550° C. or less, the occurrence of undesirable effects such as the deformation of the substrate 10 (the substrate main body 1) or the deposition of metal due to exposure to a high temperature is suppressed.

Figure 8A:
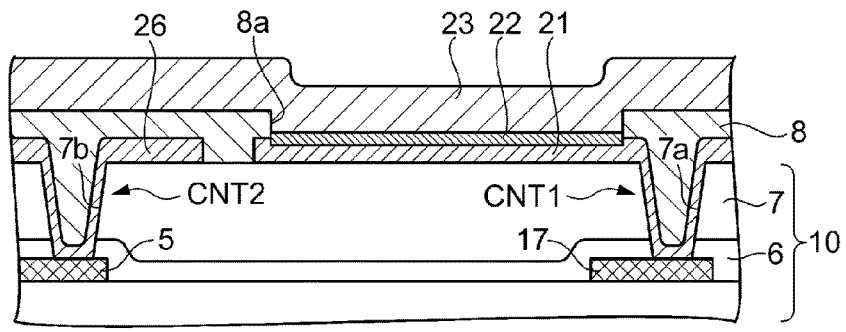
FIGS. 8A to 8C are diagrams for explaining the method for manufacturing the photosensor according to the first embodiment.

By applying the heat treatment in the $H_2Se$ atmosphere in this manner, the p-type semiconductor layer 23 composed of a semiconductor film with chalcopyrite structure is formed as shown in FIG. 8A. In the embodiment, by applying the heat treatment in the $H_2Se$ atmosphere, the metal film 23a (Cu) and the metal film 23b (In) are selenized to form the p-type semiconductor layer 23 composed of a CIS ($CuInSe_2$)-based film.

As the metal film for forming the p-type semiconductor layer 23, a metal film further containing gallium (Ga) as a Group 13 element, in addition to Cu and In, may be formed. In this case, in the step shown in FIG. 7D, a metal film 23a made of an alloy of Cu and Ga is deposited, and the metal film 23b made of In is stacked on the metal film 23a. Then, by applying the heat treatment, the metal film 23a (CuGa) and the metal film 23b (In) are selenized to form the p-type semiconductor layer 23 composed of a CICS (Cu(In,Ga)$Se_2$)-based film.

Moreover, a surface layer portion of the lower electrode film 21b (Mo) in the region overlapping the opening 8a in the plan view is selenized by applying the heat treatment in the $H_2Se$ atmosphere, so that a molybdenum selenide ($MoSe_2$) film as a selenide of molybdenum is formed. This selenized film serves as the intermediate layer 22. The Mo film of the lower electrode film 21b at a non-selenized portion (the lower side of the intermediate layer 22 in the region overlapping the opening 8a in the plan view, and a portion not overlapping the opening 8a in the plan view) serves as the lower electrode 21. As a result, the intermediate layer 22 is disposed between the lower electrode 21 and the p-type semiconductor layer 23.

By the heat treatment as described above, the p-type semiconductor layer 23 with chalcopyrite structure is formed, and at the same time, the selenized film obtained by selenizing molybdenum is formed as the intermediate layer 22 between the lower electrode 21 and the p-type semiconductor layer 23 in the opening 8a. Therefore, since an ohmic contact is obtained at a boundary between the lower electrode 21 and the intermediate layer 22 and at a boundary between the intermediate layer 22 and the p-type semiconductor layer 23, the contact resistance between the lower electrode 21 and the p-type semiconductor layer 23 can be minimized. Moreover, the adhesion of these layers at their interfaces can be improved.

The film thickness of the intermediate layer 22 ($MoSe_2$ film) is preferably 100 nm or less. As the film thickness of the intermediate layer 22 is thicker, the film thickness of the Mo film remaining as the lower electrode 21 becomes thinner and thus the wiring resistance is increased. Further, when the lower electrode film 21b is selenized throughout its entire film thickness, the lower electrode 21 (Mo film) does not remain, and thus the p-type semiconductor layer 23 peels off from the substrate 10.

When the Mo film is selenized and converted into the $MoSe_2$ film, the film thickness of the $MoSe_2$ film is multiple times the film thickness of the original Mo film. In the embodiment, the original film thickness of the lower electrode film 21b is 250 nm, while the film thicknesses of the intermediate layer 22 ($MoSe_2$ film) and the remaining lower electrode 21 (Mo film) are about 100 nm and about 200 nm, respectively.

If the insulating layer 8 is not formed in the heat treatment described above, surface layer portions of the lower electrode film 21b and the relay electrode 26 are selenized in the entire planar region. In such a case, the wiring resistance is increased in the entire region of the lower electrode 21 including the contact hole CNT1 and the relay electrode 26 including the contact hole CNT2. Moreover, when the surface layer portion of the relay electrode 26 is selenized, the selenized film lies between the relay electrode 26 and the upper electrode 25 to be formed in contact with the relay electrode 26 in a later step, and thus the contact resistance between the upper electrode 25 and the relay electrode 26 is increased.

In contrast, a region of the lower electrode film 21b other than the region for forming the intermediate layer 22 and the entire region of the relay electrode 26 are covered with the insulating layer 8 in the embodiment. Therefore, the selenization in these regions can be suppressed in the heat treatment. Due to this, the wiring resistances of the lower electrode 21 including the contact hole CNT1 and the relay electrode 26 including the contact hole CNT2 can be minimized, and at the same time, the contact resistance between the upper electrode 25 and the relay electrode 26 can be minimized.

Figure 8B:
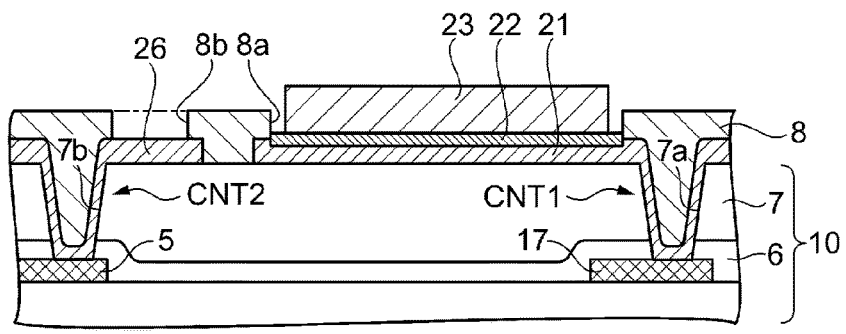

Next, as shown in FIG. 8B, a portion of the p-type semiconductor layer 23, which is located on the insulating layer 8, is removed by patterning the p-type semiconductor layer 23. Due to this, the p-type semiconductor layer 23 is disposed on the intermediate layer 22 in the opening 8a of the insulating layer 8. The p-type semiconductor layer 23 may be patterned wider than the opening 8a such that a peripheral edge portion of the p-type semiconductor layer 23 rides up over the insulating layer 8.

Subsequently, the opening 8b is formed in a region overlapping the relay electrode 26 in the plan view but not overlapping the contact hole CNT2 in the plan view in the insulating layer 8. Due to this, the relay electrode 26 is exposed in the opening 8b.

Figure 8C:
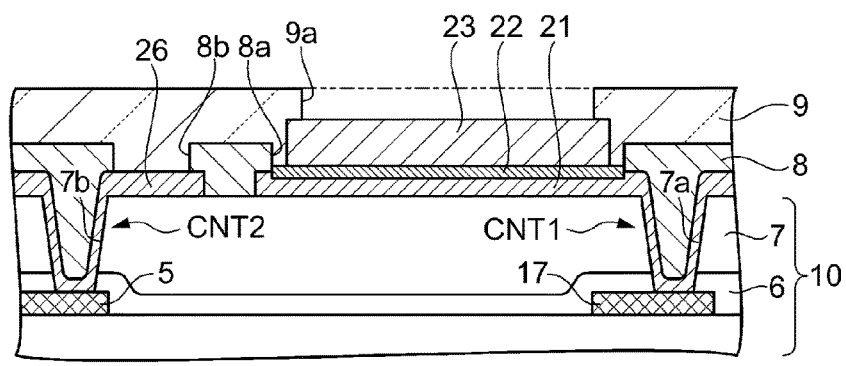

Next, as shown in FIG. 8C, the protective layer 9 made of $SiO_x$ or $SiN_x$ is formed so as to cover the relay electrode 26, the p-type semiconductor layer 23, and the insulating layer 8. In the embodiment, the protective layer 9 made of SiN is formed to a film thickness of 500 nm using CVD. Then, the opening 9a is formed in a region overlapping the p-type semiconductor layer 23 in the plan view in the protective layer 9. Due to this, the p-type semiconductor layer 23 is exposed in the opening 9a.

Figure 9A:
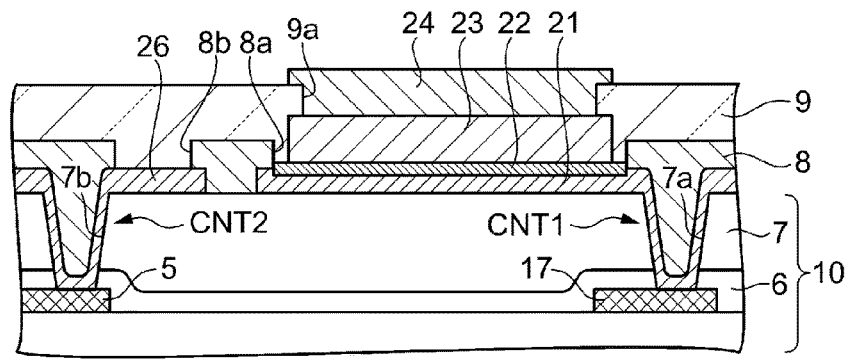
FIGS. 9A to 9C are diagrams for explaining the method for manufacturing the photosensor according to the first embodiment.

Next, as shown in FIG. 9A, an intrinsic semiconductor film and an n-type impurity-doped semiconductor film are stacked on the p-type semiconductor layer 23 to form the n-type semiconductor layer 24. In the embodiment, an undoped i-ZnO film and an n-type impurity-doped ZnO (n$^+$) film are stacked and deposited by a sputtering method and then patterned to form the n-type semiconductor layer 24.

Figure 9B:
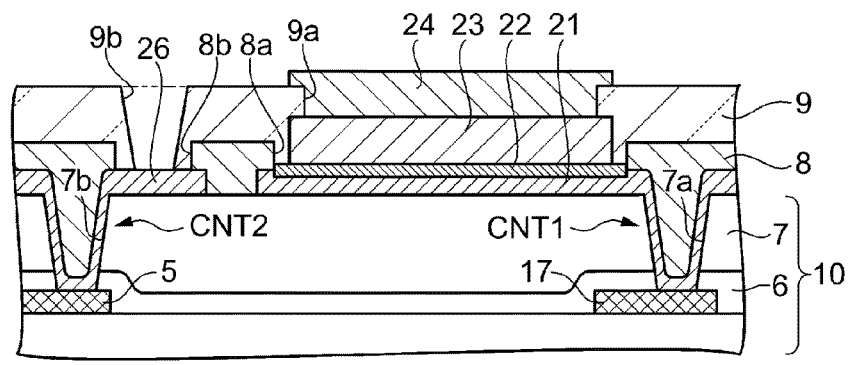

Next, as shown in FIG. 9B, the through-hole 9b reaching the relay electrode 26 is formed for forming the contact hole CNT3 in a region overlapping the opening 8b in the plan view in the protective layer 9. Due to this, the relay electrode 26 is exposed in the through-hole 9b. The opening 8b may not be formed in the insulating layer 8 in the step shown in FIG. 8B, and the through-hole 9b may be formed so as to penetrate the protective layer 9 and the insulating layer 8 in the step shown in FIG. 9B.

Figure 9C:
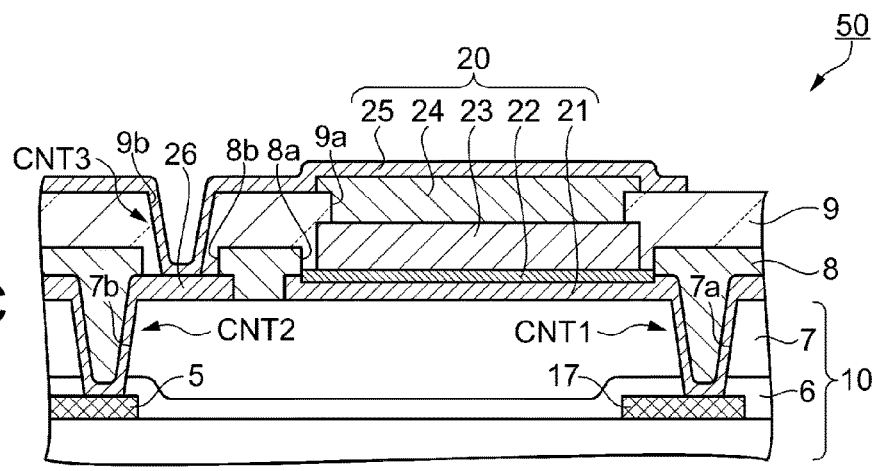

Next, as shown in FIG. 9C, the upper electrode 25 is formed of a light-transmissive conductive film so as to cover the n-type semiconductor layer 24 and fill the through-hole 9b. In the embodiment, an ITO film is deposited by a sputtering method on the n-type semiconductor layer 24 and the protective layer 9 and then patterned to form the upper electrode 25. Due to this, the photodiode 20 including the p-type semiconductor layer 23 and the n-type semiconductor layer 24 stacked and disposed between the lower electrode 21 and the upper electrode 25, and the intermediate layer 22 disposed between the lower electrode 21 and the p-type semiconductor layer 23 is configured.

Moreover, the contact hole CNT3 is formed by filling the through-hole 9b with the conductive film constituting the upper electrode 25. Due to this, the upper electrode 25 is electrically connected to the relay electrode 26 via the contact hole CNT3, is electrically connected to the relay wiring 5 via the contact hole CNT2, and is further electrically connected to the gate electrode 3g via the relay wiring 5. As a result, the photosensor 50 including the photodiode 20 is configured.

Through the steps described above, the image sensor 100 including the photosensor 50 according to the first embodiment is completed. According to the method for manufacturing the photoelectric conversion device according to the first embodiment, the region for forming the intermediate layer 22 in the lower electrode 21 is selectively selenized, and the selenization of the other region of the lower electrode 21 and the relay electrode 26 can be suppressed by covering them with the insulating layer 8. As a result, it is possible to stably manufacture the image sensor 100 having an excellent photoelectric conversion rate, high photosensitivity over the range of wavelengths from the visible light to the near-infrared light, and high reliability.

Second Embodiment
Photoelectric Conversion Device

Figure 10:
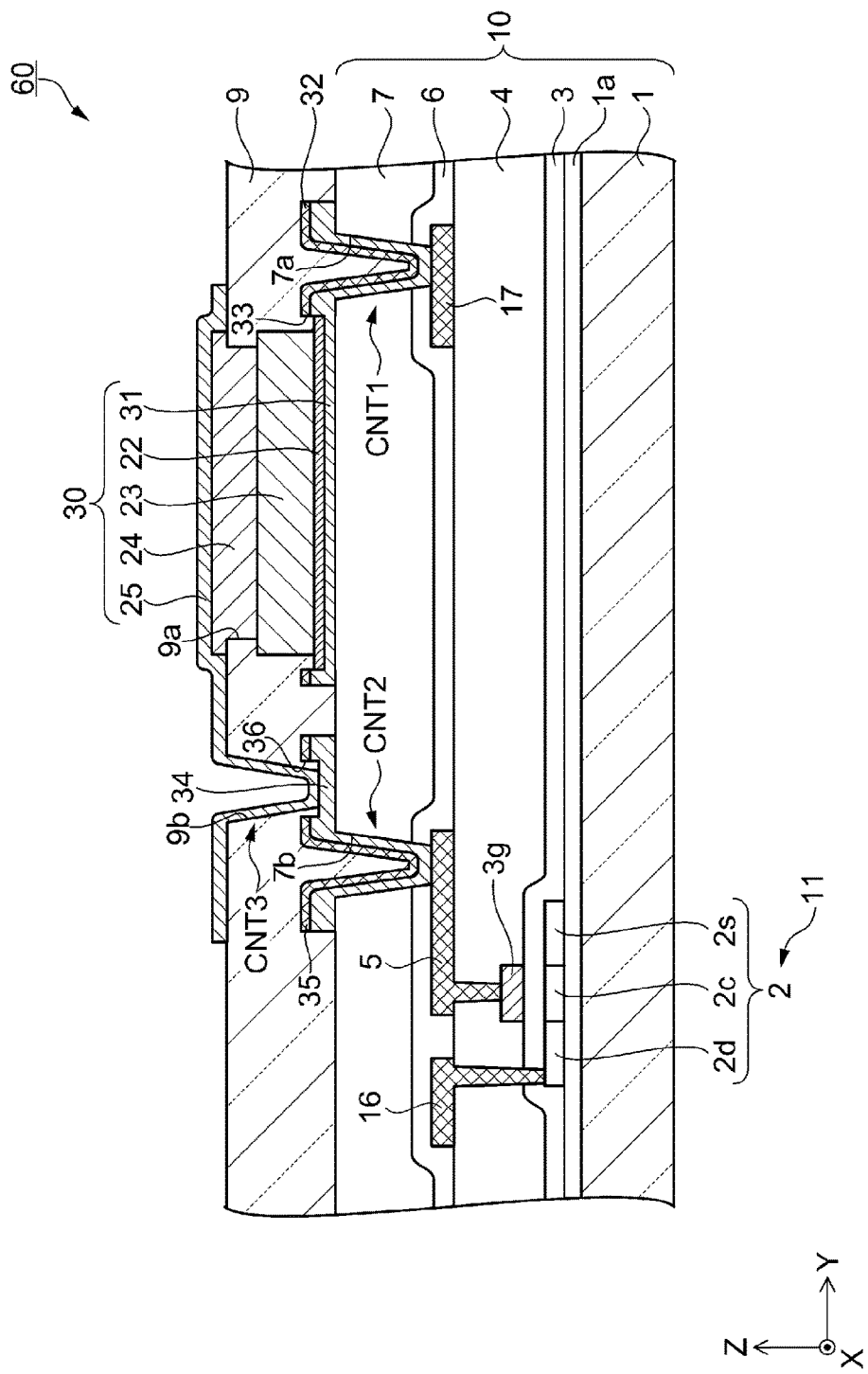
FIG. 10 is a schematic cross-sectional view showing a configuration of a photosensor according to a second embodiment.

A second embodiment differs from the first embodiment in the configuration of the photosensor in the image sensor 100 as a photoelectric conversion device. A photosensor 60 according to the second embodiment will be described with reference to FIG. 10. FIG. 10 is a schematic cross-sectional view showing a configuration of the photosensor according to the second embodiment.

As shown in FIG. 10, the photosensor 60 according to the second embodiment includes the substrate 10 and a photodiode 30 provided on the substrate 10. The substrate 10 has the configuration similar to that of the first embodiment. The photodiode 30 according to the second embodiment is composed of a lower electrode 31 as a first electrode, the intermediate layer 22 as a selenized film, the p-type semiconductor layer 23, the n-type semiconductor layer 24, and the upper electrode 25 as a second electrode, which are stacked in this order from the substrate 10 side. Moreover, the photosensor 60 includes a relay electrode 34 as a third electrode on the substrate 10 (on the planarizing layer 7).

The photosensor 60 according to the second embodiment differs from the photosensor 50 according to the first embodiment in that the insulating layer 8 is not provided on the substrate 10 (the planarizing layer 7), and that a metal oxide layer 32 and a metal oxide layer 35 are provided on the lower electrode 31 and the relay electrode 34, respectively. Herein, the photosensor 60 according to the second embodiment will be described focusing on differences from the photosensor 50 according to the first embodiment.

The lower electrode 31 and the relay electrode 34 are formed in the same layer on the substrate 10 (on the planarizing layer 7). The lower electrode 31 and the relay electrode 34 are composed of a conductive film containing a high-melting-point metal as a first metal, similarly to the first embodiment. The planar shape and arrangement of the lower electrode 31 and the relay electrode 34 are similar to the planar shape and arrangement of the lower electrode 21 and the relay electrode 26 in the first embodiment.

By filling the through-hole 7a provided in the planarizing layer 7 with the conductive film constituting the lower electrode 31, the contact hole CNT1 for electrically connecting to the negative power supply line 17 is formed. Moreover, by filling the through-hole 7b provided in the planarizing layer 7 with the conductive film constituting the relay electrode 34, the contact hole CNT2 for electrically connecting to the relay wiring 5 is formed.

The metal oxide layer 32 is formed on the lower electrode 31, and the metal oxide layer 35 is formed on the relay electrode 34. The metal oxide layer 32 and the metal oxide layer 35 are made of an oxide of the high-melting-point metal constituting the lower electrode 31 and the relay electrode 34. That is, the metal oxide layer 32 and the metal oxide layer 35 are oxidized surface layer portions of the conductive film (the conductive film 21a shown in FIG. 11A) deposited as the lower electrode 31 and the relay electrode 34. When Mo is used as the high-melting-point metal constituting the lower electrode 31 and the relay electrode 34, the metal oxide layer 32 and the metal oxide layer 35 are composed of molybdenum oxide ($MoO_2$, $MoO_3$, etc.).

Figure 11A:
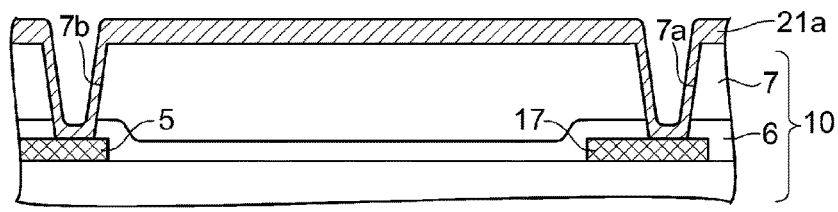
FIGS. 11A to 11D are diagrams for explaining a method for manufacturing the photosensor according to the second embodiment.
Figure 11B:
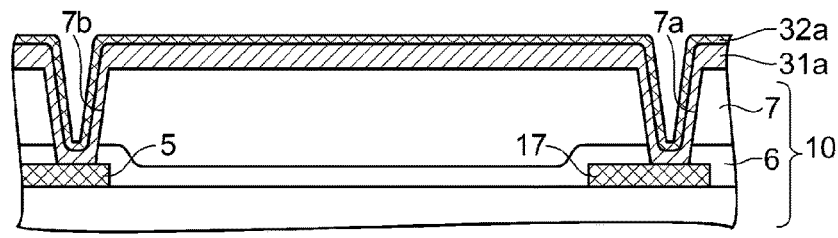
Figure 11C:
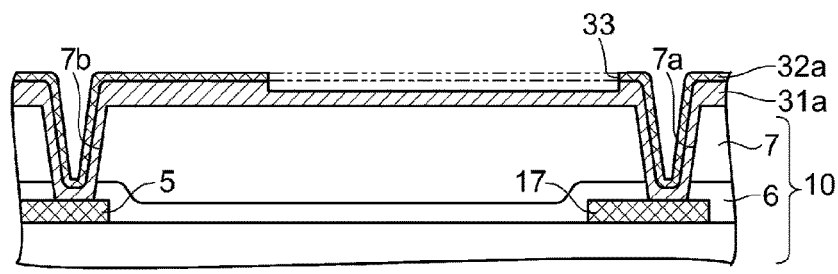
Figure 11D:
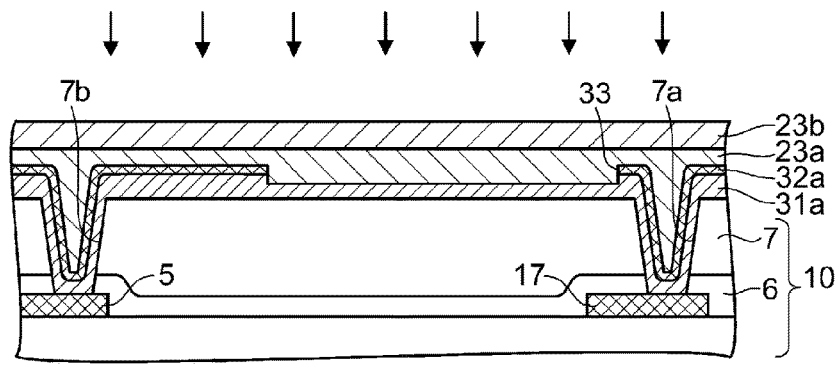

Similarly to the insulating layer 8 in the first embodiment, the metal oxide layer 32 and the metal oxide layer 35 play a role of suppressing the selenization of a conductive film 31a serving as the lower electrode 31 and the relay electrode 34 other than a portion of the conductive film 31a in a region for forming the intermediate layer 22 in a step of applying a heat treatment for forming the p-type semiconductor layer 23 with chalcopyrite structure (see FIG. 11D).

The metal oxide layer 32 formed on the lower electrode 31 includes an opening 33. The intermediate layer 22 composed of a selenized film ($MoSe_2$, etc.) obtained by selenizing a surface layer portion of the conductive film deposited as the lower electrode 31 is disposed on the lower electrode 31 in a region overlapping the opening 33 in the plan view. The layer thickness of the lower electrode 31 at a portion overlapping the intermediate layer 22 in the plan view is thinner than the layer thickness at a peripheral edge portion. The layer thickness of the intermediate layer 22 is about the same as that of the first embodiment. Moreover, the layer thickness of the lower electrode 31 at the portion overlapping the intermediate layer 22 in the plan view is thinner than the layer thickness of the relay electrode 34.

Also in the photosensor 60 according to the second embodiment, the intermediate layer 22 composed of the selenized film is disposed between the lower electrode 31 and the p-type semiconductor layer 23 of the photodiode 30. Hence, since an ohmic contact is obtained at each of boundaries between the lower electrode 31 and the intermediate layer 22 and between the intermediate layer 22 and the p-type semiconductor layer 23, the contact resistance between the lower electrode 31 and the p-type semiconductor layer 23 can be minimized. Moreover, the adhesion of these layers at their interfaces can be improved. Since the selenized film is not formed in a region of the lower electrode 31 other than a portion thereof in contact with the p-type semiconductor layer 23, the wiring resistance of the lower electrode 31 can be minimized.

The metal oxide layer 35 formed on the relay electrode 34 includes an opening 36. The relay electrode 34 is electrically connected with the upper electrode 25 provided in a higher layer via the contact hole CNT3 formed in a region overlapping the opening 36 in the plan view. Since the metal oxide layer 35 or a selenized film is not formed at a portion of the relay electrode 34 in contact with the upper electrode 25, the contact resistance between the relay electrode 34 and the upper electrode 25 can be minimized. Moreover, since a selenized film is not formed on the relay electrode 34 not only at the portion in contact with the upper electrode 25 but in the entire region, the wiring resistance of the relay electrode 34 can be minimized.

The layer thickness of the metal oxide layer 32 and the metal oxide layer 35 is preferably from about 10 nm to 100 nm. For example, when the film thickness of the conductive film deposited as the lower electrode 31 and the relay electrode 34 is set to 250 nm and a surface layer-side portion of the conductive film with a layer thickness of 50 nm is oxidized, the surface layer side of the conductive film becomes thick by oxidation, and thus the metal oxide layer 32 and the metal oxide layer 35 each with a layer thickness of about 100 nm are formed. In this case, the conductive film with a layer thickness of about 200 nm remains as the lower electrode 31 and the relay electrode 34.

As has been described above, the photodiode 30 according to the second embodiment also includes the p-type semiconductor layer 23 with chalcopyrite structure similarly to the photodiode 20 according to the first embodiment. Therefore, the photodiode 30 has an excellent photoelectric conversion rate and high photosensitivity over the wide range of wavelengths from the visible light to the near-infrared light. Besides, since an ohmic contact is obtained at each of the boundaries between the lower electrode 31 and the intermediate layer 22 and between the intermediate layer 22 and the p-type semiconductor layer 23, the contact resistance between the lower electrode 31 and the p-type semiconductor layer 23 can be minimized. Moreover, since the contact hole CNT1 portion of the lower electrode 31 and the relay electrode 34 including the contact hole CNT2 portion are not selenized, the wiring resistance can be minimized. Due to these, it is possible, similarly to the first embodiment, to provide the image sensor 100 that stably operates with high sensitivity over the wide range of wavelengths from the visible light to the near-infrared light.

Method for Manufacturing Photoelectric Conversion Device

Next, a method for manufacturing the photoelectric conversion device according to the second embodiment will be described with reference to FIGS. 11A to 13C. Herein, a method for manufacturing the photosensor 60 will be described focusing on differences from the first embodiment. FIGS. 11A to 13C are diagrams for explaining the method for manufacturing the photosensor according to the second embodiment. Each of FIGS. 11A to 13C corresponds to the partially enlarged view in FIG. 10.

First, as shown in FIG. 11A, the conductive film 21a containing a high-melting-point metal such as Mo (molybdenum) is formed so as to cover the substrate 10 (the planarizing layer 7) and fill the through-hole 7a and the through-hole 7b of the planarizing layer 7, similarly to the first embodiment. Also in the second embodiment, the conductive film 21a is deposited to a film thickness of 250 nm by sputtering using Mo (molybdenum) as a high-melting-point metal.

Next, as shown in FIG. 11B, a metal oxide film 32a is formed by oxidizing the surface layer side of the conductive film 21a. As a method for forming the metal oxide film 32a, for example, sputtering in an oxygen atmosphere, a heat treatment in an oxygen atmosphere (at a high temperature of 250° C. or more), or the like can be used. The surface layer side of the conductive film 21a (see FIG. 11A) is oxidized and converted into the metal oxide film 32a, and an unoxidized portion of the conductive film 21a remains as a conductive film 31a. As a result, the conductive film 31a and the metal oxide film 32a covering the conductive film 31a are formed on the substrate 10.

The film thickness of the metal oxide film 32a is preferably from about 10 nm to 100 nm as described above. When the film thickness of the metal oxide film 32a is 10 nm, the selenization of the conductive film 31a other than that in the region for forming the intermediate layer 22 can be favorably suppressed in a heat treatment described later. Moreover, when the film thickness of the metal oxide film 32a is 100 nm or less, processing for removing the metal oxide film 32a at the opening 33 can be facilitated in forming the opening 33 in the metal oxide film 32a in the next step. In the embodiment, the original film thickness of the conductive film 21a is 250 nm, while the film thicknesses of the metal oxide film 32a ($MoO_x$) and the remaining conductive film 31a (Mo) are about 100 nm and about 200 nm, respectively.

Next, as shown in FIG. 11C, a portion of the metal oxide film 32a, which overlaps the region for forming the intermediate layer 22 in the plan view, is removed by an etching treatment or the like to form the opening 33. In the etching treatment, the amount of etching is appropriately adjusted so as not to excessively reduce the film thickness of the conductive film 31a while definitely removing the metal oxide film 32a in the opening 33. Due to this, the conductive film 31a is exposed in the opening 33 of the metal oxide film 32a.

Next, as shown in FIG. 11D, the metal film 23a made of copper (Cu) and the metal film 23b made of indium (In) are stacked and deposited using a sputtering method or the like as a metal film containing a Group 11 element and a Group 13 element so as to cover the conductive film 31a exposed in the opening 33 and the metal oxide film 32a.

Subsequently, as shown in FIG. 11D, a heat treatment is applied to the metal film 23a and the metal film 23b in an atmosphere of gas containing a Group 16 element. Also in the second embodiment, hydrogen selenide ($H_2Se$) is used as the gas containing a Group 16 element, and the heat treatment is applied in the $H_2Se$ atmosphere at a temperature of 450° C.

Figure 12A:
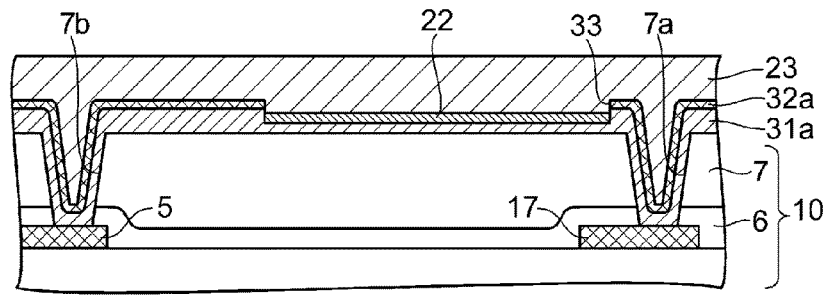
FIGS. 12A to 12D are diagrams for explaining the method for manufacturing the photosensor according to the second embodiment.

By applying the heat treatment in the $H_2Se$ atmosphere, the p-type semiconductor layer 23 composed of a semiconductor film with chalcopyrite structure is formed as shown in FIG. 12A. In the embodiment, the p-type semiconductor layer 23 composed of a CIS ($CuInSe_2$)-based film is formed. Moreover, a surface layer portion of the conductive film 31a (Mo) in a region overlapping the opening 33 in the plan view is selenized, so that the intermediate layer 22 composed of a molybdenum selenide ($MoSe_2$) film is formed. As a result, the intermediate layer 22 is disposed between the conductive film 31a serving as the lower electrode 31 and the p-type semiconductor layer 23.

In the embodiment, the original film thickness of the conductive film 31a is 200 nm, while the film thicknesses of the intermediate layer 22 ($MoSe_2$) and the remaining conductive film 31a (Mo) are about 100 nm and about 150 nm, respectively. As a result, the layer thickness of the conductive film 31a at a portion overlapping the intermediate layer 22 in the plan view is thinner the layer thickness of the conductive film 31a in the other region including a portion serving as the relay electrode 34 in a later step.

In this heat treatment, a region of the conductive film 31a other than that in the opening 33 for forming the intermediate layer 22 is covered with the metal oxide film 32a, and therefore, the selenization in the region can be suppressed. Due to this, the wiring resistances of the lower electrode 31 including the contact hole CNT1 to be formed in a later step and the relay electrode 34 including the contact hole CNT2 can be minimized, and the contact resistance between the upper electrode 25 and the relay electrode 34 can be minimized.

Here, the metal film 23a (and the metal film 23b) deposited in the step shown in FIG. 11D is in contact with the conductive film 31a in the opening 33 of the metal oxide film 32a, and is in contact with the metal oxide film 32a in a region other than that in the opening 33. The p-type semiconductor layer 23 formed through the heat treatment and shown in FIG. 12A is in contact with the intermediate layer 22 in the opening 33 of the metal oxide film 32a, and is in contact with the metal oxide film 32a in a region other than that in the opening 33. The adhesion between the p-type semiconductor layer 23 (or the metal film 23a before the heat treatment) and the metal oxide film 32a is more favorable than the adhesion between the p-type semiconductor layer 23 (or the metal film 23a before the heat treatment) and the insulating layer 8 in the first embodiment.

Hence, compared to the case where the p-type semiconductor layer 23 (or the metal film 23a before the heat treatment) is in contact with the insulating layer 8 in a region other than that in the opening 8a of the insulating layer 8 in the first embodiment (see FIG. 8A), the adhesion of the p-type semiconductor layer 23 (or the metal film 23a before the heat treatment) to the substrate 10 side is improved in the second embodiment. Therefore, the lifting or film peeling-off of the p-type semiconductor layer 23 (or the metal film 23a and the metal film 23b stacked on each other) is less likely to occur between the step shown in FIG. 11D and the step shown in FIG. 12B than in the first embodiment. Due to this, stable production and improved manufacturing yield can be achieved in the second embodiment compared to the first embodiment.

Figure 12B:
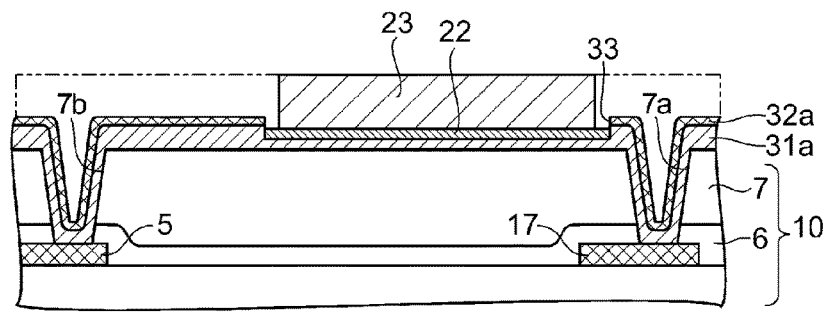

Next, as shown in FIG. 12B, a portion of the p-type semiconductor layer 23, which is located on the metal oxide film 32a, is removed by patterning the p-type semiconductor layer 23. Due to this, the p-type semiconductor layer 23 is disposed on the intermediate layer 22 in the opening 33 of the metal oxide film 32a.

Figure 12C:
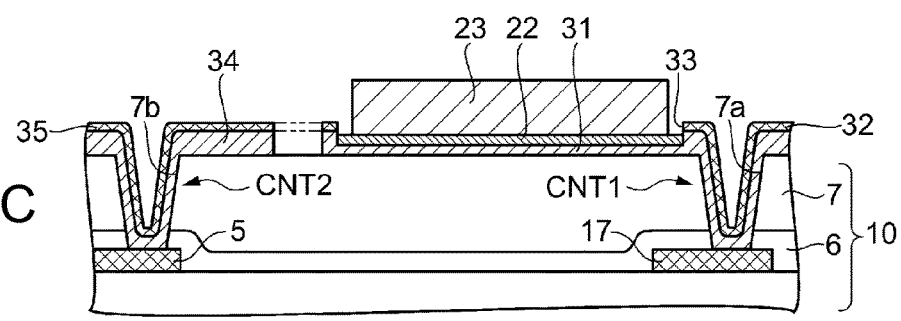

Next, as shown in FIG. 12C, the conductive film 31a is patterned to form the lower electrode 31 and the relay electrode 34. The conductive film of the lower electrode 31, which fills the through-hole 7a of the planarizing layer 7, forms the contact hole CNT1, and the lower electrode 31 is electrically connected to the negative power supply line 17 via the contact hole CNT1. The conductive film of the relay electrode 34, which fills the through-hole 7b of the planarizing layer 7, forms the contact hole CNT2, and the relay electrode 34 is electrically connected to the relay wiring 5 via the contact hole CNT2. Moreover, the metal oxide film 32a is also patterned by patterning the conductive film 31a, so that the metal oxide layer 32 and the metal oxide layer 35 are disposed on the lower electrode 31 and the relay electrode 34, respectively.

Figure 12D:
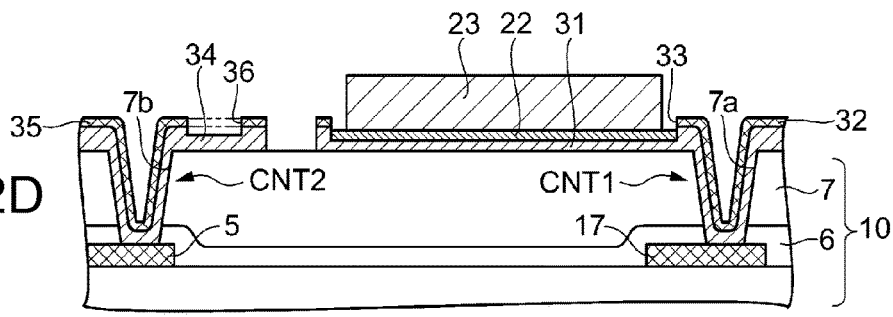

Next, as shown in FIG. 12D, a portion of the metal oxide layer 35 on the relay electrode 34, in a region not overlapping the contact hole CNT2 (the through-hole 7b of the planarizing layer 7) in the plan view, is removed by an etching treatment or the like to form the opening 36. Due to this, the relay electrode 34 is exposed in the opening 36 of the metal oxide layer 35. In the opening 36, the upper electrode 25 to be formed in a higher layer in a later step is electrically connected with the relay electrode 34.

Figure 13A:
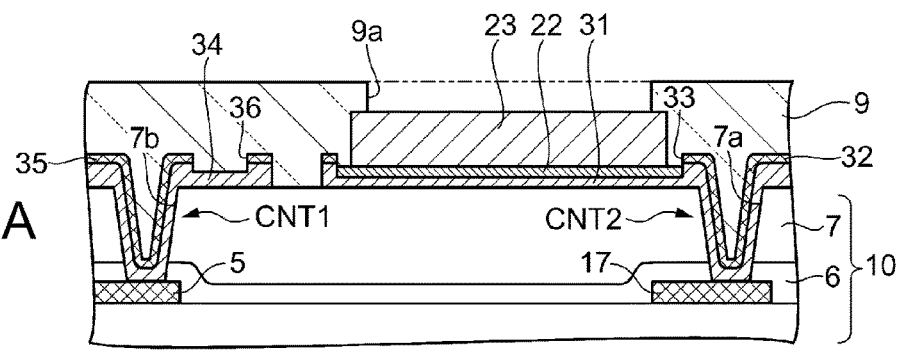
FIGS. 13A to 13C are diagrams for explaining the method for manufacturing the photosensor according to the second embodiment.

Next, as shown in FIG. 13A, the protective layer 9 made of $SiO_x$ or $SiN_x$ is formed so as to cover the lower electrode 31, the metal oxide layer 32, the p-type semiconductor layer 23, the relay electrode 34, and the metal oxide layer 35. Then, the opening 9a is formed in a region overlapping the p-type semiconductor layer 23 in the plan view in the protective layer 9. Due to this, the p-type semiconductor layer 23 is exposed in the opening 9a.

Figure 13B:
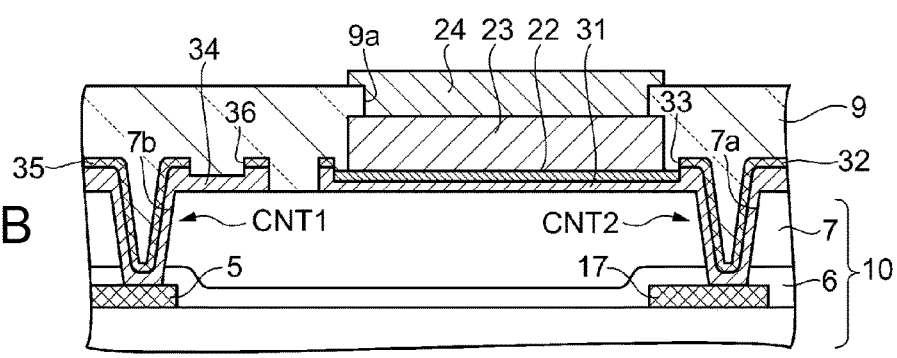

Next, as shown in FIG. 13B, an intrinsic semiconductor film such as an undoped i-ZnO film and a semiconductor film such as an n-type impurity-doped ZnO ($n^+$) film are stacked on the p-type semiconductor layer 23 by a sputtering method or the like to form the n-type semiconductor layer 24.

Figure 13C:
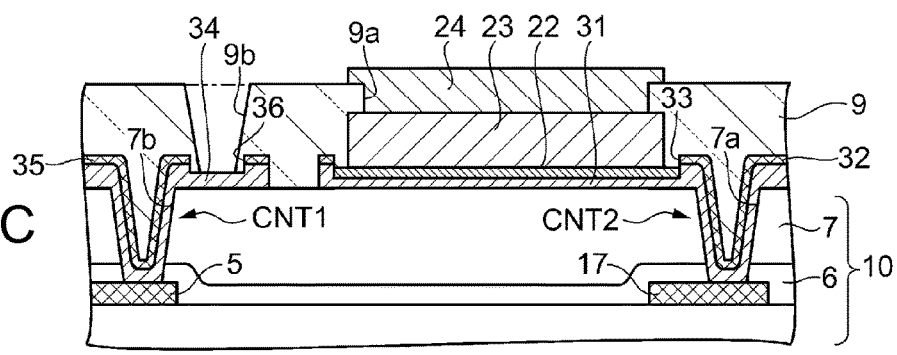

Next, as shown in FIG. 13C, the through-hole 9b reaching the relay electrode 34 is formed for forming the contact hole CNT3 in a region overlapping the opening 36 of the metal oxide layer 35 in the plan view in the protective layer 9. Due to this, the relay electrode 34 is exposed in the through-hole 9b.

Next, the upper electrode 25 is formed of a light-transmissive conductive film such as an ITO film by a sputtering method or the like so as to cover the n-type semiconductor layer 24 and fill the through-hole 9b. Due to this, as shown in FIG. 10, the photodiode 30 including the p-type semiconductor layer 23 and the n-type semiconductor layer 24 stacked and disposed between the lower electrode 31 and the upper electrode 25, and the intermediate layer 22 disposed between the lower electrode 31 and the p-type semiconductor layer 23 is configured.

Moreover, the contact hole CNT3 is formed by filling the through-hole 9b with the conductive film constituting the upper electrode 25. Due to this, the upper electrode 25 is electrically connected to the relay electrode 34 via the contact hole CNT3, is electrically connected to the relay wiring 5 via the contact hole CNT2, and is further electrically connected to the gate electrode 3g via the relay wiring 5. As a result, the photosensor 60 including the photodiode 30 is configured.

Through the steps described above, the image sensor 100 including the photosensor 60 according to the second embodiment is completed. According to the method for manufacturing the photoelectric conversion device according to the second embodiment, the region of the lower electrode 31 for forming the intermediate layer 22 is selectively selenized, and the selenization of the other region of the lower electrode 31 and the relay electrode 34 can be suppressed by covering them with the metal oxide layer 32 and the metal oxide layer 35, similarly to the first embodiment.

Besides, compared to the first embodiment, the occurrence of lifting or film peeling-off of the p-type semiconductor layer 23 can be suppressed to achieve stable production and improved manufacturing yield. As a result, it is possible to more stably manufacture the image sensor 100 having an excellent photoelectric conversion rate, high photosensitivity over the range of wavelengths from the visible light to the near-infrared light, and high reliability.

Each of the embodiments described above only shows one aspect of the invention, and any modifications and applications are possible within the scope of the invention. For example, the following modified examples can be considered.

MODIFIED EXAMPLE 1

Figure 14A:
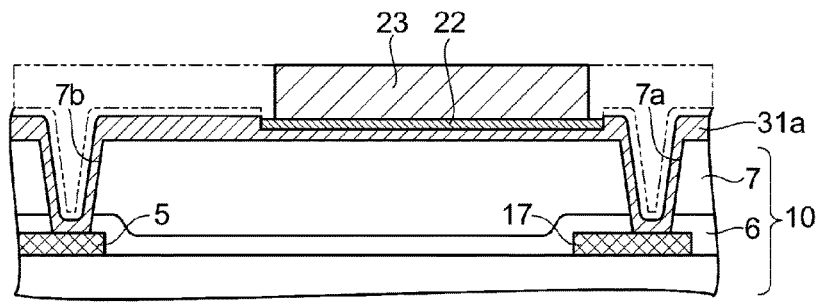
FIGS. 14A to 14C are diagrams for explaining a method for manufacturing a photosensor according to Modified Example 1.
Figure 14B:
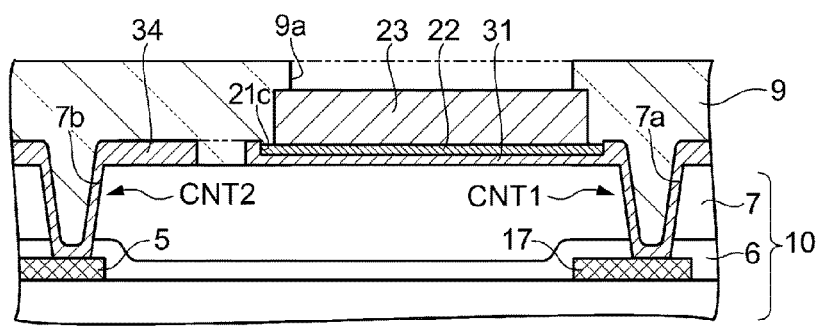
Figure 14C:
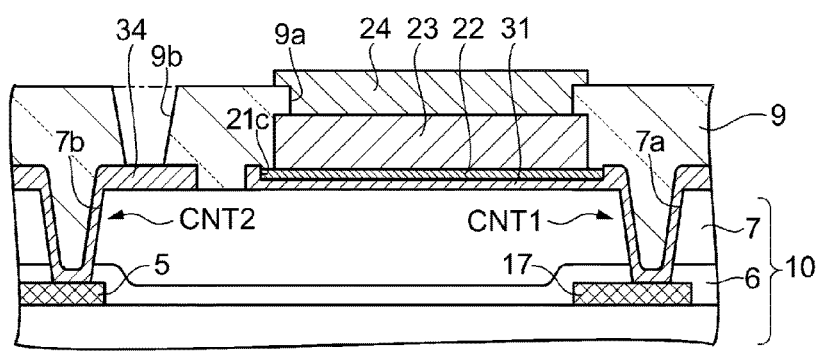

The second embodiment has a configuration in which the metal oxide film 32a formed on the conductive film 31a in the step shown in FIG. 11B remains, also in the completed state of the photosensor 60 shown in FIG. 10, as the metal oxide layer 32 on the lower electrode 31 and the metal oxide layer 35 on the relay electrode 34. However, the invention is not limited to such a form. For example, the invention may adopt a configuration in which the metal oxide film 32a (the metal oxide layer 32 and the metal oxide layer 35) does not remain. FIGS. 14A to 14C are diagrams for explaining a method for manufacturing a photosensor according to Modified Example 1.

FIG. 14A corresponds to the step of patterning the p-type semiconductor layer 23 to remove the region other than the portion located on the intermediate layer 22 shown in FIG. 12B of the second embodiment. In Modified Example 1 as shown in FIG. 14A, the metal oxide film 32a is removed by overetching in the entire region on the conductive film 31a in patterning the p-type semiconductor layer 23. Due to this, since the conductive film 31a is exposed in the entire region including a portion serving as the relay electrode 34, the step of forming the opening 36 in the metal oxide layer 35 to expose the relay electrode 34, shown in FIG. 12D of the second embodiment, becomes unnecessary.

After that, the conductive film 31a is patterned to form the lower electrode 31 and the relay electrode 34 similarly to the second embodiment, and as shown in FIG. 14B, the protective layer 9 is formed so as to cover the lower electrode 31, the p-type semiconductor layer 23, and the relay electrode 34. Then, as shown in FIG. 14C, when the through-hole 9b for forming the contact hole CNT3 is formed in the protective layer 9, the relay electrode 34 is exposed in the through-hole 9b. Hence, according to the method for manufacturing the photosensor according to Modified Example 1, the step shown in FIG. 12D becomes unnecessary compared to the second embodiment, and therefore, the productivity of the image sensor 100 can be improved.

MODIFIED EXAMPLE 2

In the embodiments, the p-type semiconductor layer 23 is composed of a CIS-based or CIGS-based film with chalcopyrite structure containing a Group 11 element, a Group 13 element, and a Group 16 element. However, the invention is not limited to such a form. For example, the p-type semiconductor layer 23 may be composed of a CZTS ($Cu_2ZnSnS_4$)-based film containing a Group 11 element, a Group 12 element, a Group 14 element, and a Group 16 element. For example, in the steps shown in FIGS. 7D and 11D, a metal film containing copper (Cu) as a Group 11 element, zinc (Zn) as a Group 12 element, and tin (Sn) as a Group 14 element is formed on the lower electrode film 21b and subjected to a heat treatment in an atmosphere containing sulfur (S) as a Group 16 element, whereby the p-type semiconductor layer 23 can be composed of a CZTS-based film.

MODIFIED EXAMPLE 3

In the embodiments, the image sensor 100 including the photodiode 20 or the photodiode 30 including the semiconductor film with chalcopyrite structure has been described by way of example as a photoelectric conversion device. However, the invention is not limited to such a form. The photoelectric conversion device may be a solar cell including the photodiode 20 or the photodiode 30 including the semiconductor film with chalcopyrite structure.

MODIFIED EXAMPLE 4

In the embodiment, the biological information acquiring device 200, which is a portable information terminal device that can obtain image information of a blood vessel or information of a specific component in blood or the like, has been described by way of example as an electronic apparatus. However, the invention is not limited to such a form. The electronic apparatus may be an information terminal device in a different form such as of a stationary type, or may be a biometric authentication device that acquires image information of a finger vein and compares the image information with previously registered image information of veins to identify an individual. Moreover, the electronic apparatus may be a solid-state imaging device that captures an image of a fingerprint, the eyeball iris, or the like.

The entire disclosures of Japanese Patent Application No. 2014-246582 filed Dec. 5, 2014 and No. 2015-121781 filed Jun. 17, 2015 are hereby incorporated herein by reference.

What is claimed is:

1. A photoelectric conversion device comprising:
a first electrode containing a first metal;
a second electrode disposed in a layer higher than the first electrode; a semiconductor layer disposed between the first electrode and the second electrode; and
a third electrode containing the first metal, wherein the first electrode and the third electrode are formed in the same layer, and
a selenized film of the first metal is formed directly on the first electrode,
wherein an insulating layer and a protective layer are located between the first electrode and the second electrode, the protective layer being formed from a material including silicon, and
wherein a layer thickness of the first electrode is thinner than a layer thickness of the third electrode.

2. The photoelectric conversion device according to claim 1,
wherein an insulating layer including an opening is formed on the first electrode and the third electrode, and
the selenized film is disposed in a region overlapping the opening in a plan view.

3. An electronic apparatus comprising:
the photoelectric conversion device according to claim 2; and
a light-emitting device stacked on the photoelectric conversion device.

4. The photoelectric conversion device according to claim 1,
wherein a metal oxide layer including an opening is formed on the first electrode and the third electrode, and
the selenized film is disposed in a region overlapping the opening in a plan view.

5. An electronic apparatus comprising:
the photoelectric conversion device according to claim 4; and
a light-emitting device stacked on the photoelectric conversion device.

6. The photoelectric conversion device according to claim 1,
wherein the second electrode and the third electrode are electrically connected.

7. The photoelectric conversion device according to claim 6, further comprising a transistor,
wherein the third electrode is electrically connected to a gate electrode of the transistor.

8. An electronic apparatus comprising:
the photoelectric conversion device according to claim 7; and
a light-emitting device stacked on the photoelectric conversion device.

9. An electronic apparatus comprising:
the photoelectric conversion device according to claim 6; and
a light-emitting device stacked on the photoelectric conversion device.

10. The photoelectric conversion device according to claim 1,
wherein the semiconductor layer includes a semiconductor film with chalcopyrite structure.

11. An electronic apparatus comprising:
the photoelectric conversion device according to claim 10; and
a light-emitting device stacked on the photoelectric conversion device.

12. An electronic apparatus comprising:
the photoelectric conversion device according to claim 1; and
a light-emitting device stacked on the photoelectric conversion device.

* * * * *